une ill US012273120B2

(12) United States Patent
Clara et al.

(10) Patent No.: US 12,273,120 B2
(45) Date of Patent: Apr. 8, 2025

(54) APPARATUS FOR ANALOG-TO-DIGITAL CONVERSION, SYSTEMS FOR ANALOG-TO-DIGITAL CONVERSION AND METHOD FOR ANALOG-TO-DIGITAL CONVERSION

(71) Applicant: Intel Corporation, Santa Clara, CA (US)

(72) Inventors: Martin Clara, Santa Clara, CA (US); Daniel Gruber, St. Andrae (AT); Christian Lindholm, Villach (AT); Michael Fulde, Weil (DE); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/358,084

(22) Filed: Jun. 25, 2021

(65) Prior Publication Data

US 2022/0416800 A1     Dec. 29, 2022

(51) Int. Cl.
*H03M 1/12* (2006.01)
*H03M 1/14* (2006.01)
*H03M 1/36* (2006.01)
*H03M 1/38* (2006.01)

(52) U.S. Cl.
CPC ......... *H03M 1/121* (2013.01); *H03M 1/1245* (2013.01); *H03M 1/145* (2013.01); *H03M 1/38* (2013.01); *H03M 1/1215* (2013.01); *H03M 1/361* (2013.01)

(58) Field of Classification Search
CPC ...... H03M 1/121; H03M 1/1245; H03M 1/38; H03M 1/145; H03M 1/1215; H03M 1/361
See application file for complete search history.

(56) References Cited

U.S. PATENT DOCUMENTS 8,884,801 B1 * 11/2014 Ranjbar .............. H03M 1/0609
341/163
2018/0013443 A1 * 1/2018 Chao ....................... H03M 1/38

* cited by examiner

*Primary Examiner* — Khai M Nguyen
(74) *Attorney, Agent, or Firm* — 2SPL Patent Attorneys PartG mbB; Kieran O'Leary

(57) ABSTRACT

An apparatus for analog-to-digital conversion is provided. The apparatus includes a first analog-to-digital converter (ADC) configured to receive an input signal and convert the input signal to a sequence of M-bit digital values. The apparatus further includes a second ADC including a plurality of time-interleaved sub-ADCs each being configured to receive the input signal and at least one M-bit digital value of the sequence of M-bit digital values. Further, each of the plurality of time-interleaved sub-ADCs is configured to convert the input signal to a respective sequence of B-bit digital values using the at least one M-bit digital value of the sequence of M-bit digital values. M and B are integers with M<B.

18 Claims, 16 Drawing Sheets

APPARATUS FOR ANALOG-TO-DIGITAL CONVERSION, SYSTEMS FOR ANALOG-TO-DIGITAL CONVERSION AND METHOD FOR ANALOG-TO-DIGITAL CONVERSION

FIELD

The present disclosure relates to analog-to-digital conversion. In particular, examples relate to an apparatus for analog-to-digital conversion, a (first) system for analog-to-digital conversion, a (second) system for analog-to-digital conversion, a receiver comprising the apparatus or system, a base station comprising the receiver, a mobile device comprising the receiver and a method for analog-to-digital conversion.

BACKGROUND

Time-interleaved analog-to-digital converters (ADCs) are commonly used for applications requiring high sampling rates and high resolution output data. A time-interleaved ADC consists of a number N of individual sub-ADCs driven by a front-end buffer. Each sub-ADC is limited by a conversion speed. For a target sampling speed $f_{CLK}$ and a maximum sub-ADC conversion speed $f_{S1}$ the minimum number of sub-ADCs is based on $$N = \left\lceil \frac{f_{CLK}}{f_{S1}} \right\rceil.$$

However, for high sampling speeds the number N of required sub-ADCs increases. Accordingly, the physical dimension of the time-interleaved ADC may become larger and a number of errors sources and power dissipation may increase.

Hence, there may be a desire for improved analog-to-digital conversion.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
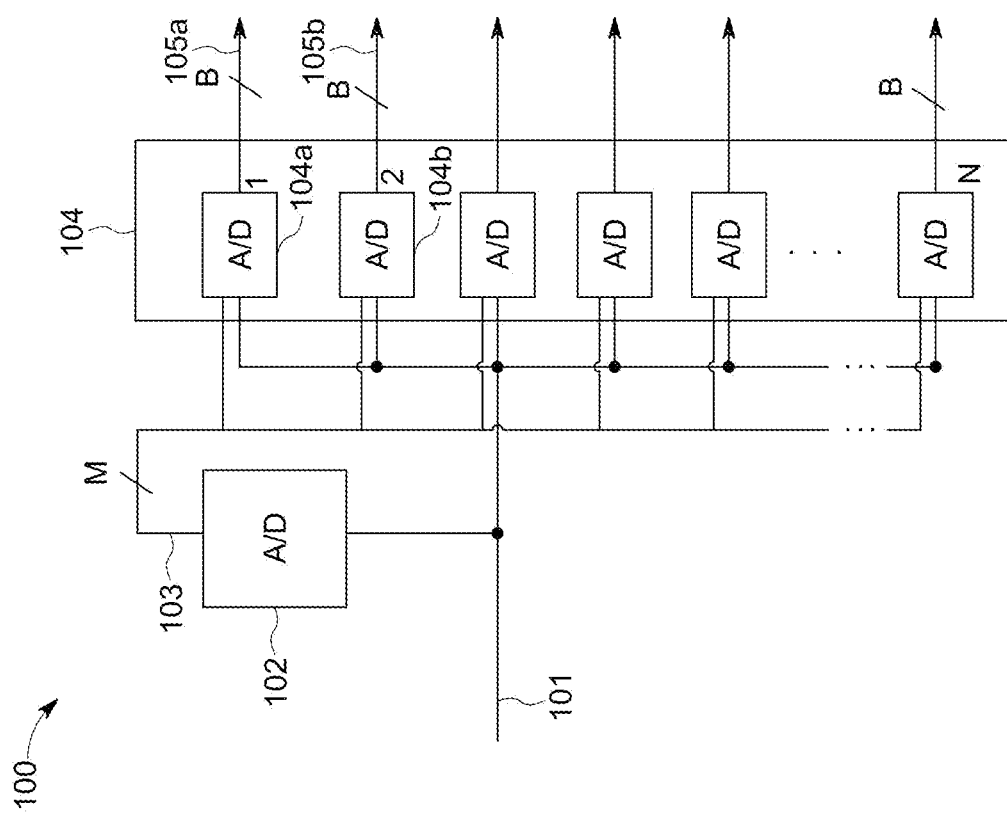
FIG. 1 illustrates an example of an apparatus for analog-to-digital conversion.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows an example of an apparatus 100 for analog-to-digital conversion. The apparatus 100 comprises a first ADC 102 configured to receive an input signal 101 and convert the input signal 101 to a sequence of M-bit digital values 103 (indicated by the annotation "M" in FIG. 1). The apparatus 100 further comprises a second ADC 104 comprising a plurality of time-interleaved sub-ADCs 104a, 104b etc. each being configured to receive the input signal 101 and at least one M-bit digital value of the sequence of M-bit digital values 103. The second ADC 104 may be understood as a time-interleaved ADC (TI-ADC). Further, each of the plurality of time-interleaved sub-ADCs 104a, 104b is configured to convert the input signal 101 to a respective sequence of B-bit digital values 105a, 105b (indicated by the annotation "B" in FIG. 1) using the at least one M-bit digital value of the sequence of M-bit digital values 103. M and B are integers with M<B.

The first ADC 102 receives the input signal 101 (e.g. a radio frequency (RF) signal) and generates a coarse digital output being the sequence of M-bit digital values 103. The second ADC 104 comprises N≥2 sub-ADCs 104a, 104b etc. operating successively in a time-interleaved manner. Each of the sub-ADCs 104a, 104b receives the input signal 101 and one or more M-bit digital values of the sequence of M-bit digital values 103 to generate a more accurate digital output (with respect to the coarse digital output from the first ADC 102) being the respective sequence of B-bit digital values. Since M is smaller than B, the digital output generated by each of the sub-ADCs 104a, 104b is more accurate than the digital output generated by the first ADC 102. In other words, the first ADC 102 exhibits a first resolution and each of the sub-ADCs 104a, 104b exhibits a second resolution being higher than the first resolution. Since each of the sub-ADCs 104a, 104b receives the respective coarse output from the first ADC 102, each of the sub-ADCs 104a, 104b can convert the input signal 101 to the respective sequence of B-bit digital values 105a, 105b during a shorter conversion period (compared to a sub-ADC not receiving the at least one M-bit digital value from the first ADC). Due to the reduced conversion period, each of the sub-ADCs 104a, 104b can operate at a higher sampling frequency compared to a sub-ADC not receiving the coarse output from the first ADC. In other words, each of the sub-ADCs 104a, 104b is able to finish the conversion process earlier (compared to a sub-ADC not using the coarse output from the first ADC), which results in a higher effective sampling rate for the sub-ADCs. The sequences of the B-bit digital values from each sub-ADC are combinable to a digital output signal corresponding to the input signal 101 being received by each of the ADCs. According to the proposed technique, less sub-ADCs 104a, 104b may be needed for obtaining the digital output signal of appropriate accuracy. Accordingly, the second ADC 104 (or in general time-interleaved ADCs) can be implemented with reduced (e.g. vertical) size or in a more power-efficient manner since it uses the coarse output 103 from the (e.g. fast converting) first ADC 102. Further, the proposed technique may enable to implement a faster analog-to-digital conversion since each sub-ADC's conversion can be speeded up.

The first ADC 102 (e.g. fast ADC, coarse ADC, low resolution ADC) may be any suitable ADC being able to provide the sequence of M-Bit digital values in a fast manner for each sub-ADC 104a, 104b such that each sub-ADC 104a, 104b may be able to convert the input signal 101 to sequences of B-bit digital values 105a, 105b based on the one or more received M-Bit digital values from the first ADC 102. The first ADC 102 may comprise a sample and hold (S-H) circuit sampling the input signal 101 during a first sampling period. The first ADC 102 converts the samples and outputs the sequence of M-Bit digital values 103. A sub-ADC 104a, 104b of the second ADC 104 may start converting a respective sample of the input signal 101, sampled by the sub-ADC 104a, 104b, earliest at the end (or shortly afterwards) of the first conversion period of the first ADC 102. By this, the sub-ADC 104a, 104b may be at least able to receive the M-Bit digital value from the first ADC 102. The first sampling period of the first ADC 102 may be as long as or shorter than the (second) sampling period of one of the sub-ADCs 104a, 104b. For example, a shorter first sampling period may be sufficient, since only a coarse output (M-bit digital value) is to be provided by the first ADC 102. The first ADC 102 may exploit the remaining or unused time (which was not necessarily needed for the sample due to the coarse M-bit digital value) for the upcoming conversion.

The first ADC 102 may be a flash ADC. For example, the first ADC 102 is a voltage-based flash ADC. During the conversion phase the voltage-based flash ADC compares the sampled (and held) input voltage against a suitable set of internally generated reference voltage levels (thresholds) with an array of comparators, each receiving at least one threshold voltage and the sampled input voltage for comparison. All comparators are triggered at the same time (the begin of the conversion phase, which is non-overlapping with the sampling phase). The direct output of a flash ADC may be a thermometer code. According to another example, the first ADC 102 may be a (power-efficient) time-based flash ADC (e.g. time to digital converter, TDC). In the time-based flash ADC the sampled input voltage is typically converted into a proportional time delay, which is then measured by a delay line calibrated to a suitable full-scale value. The output of the typically resampled delay line may again represent a thermometer code, which is the digitized version of the previously sampled analog input voltage. Using a type of a flash ADC for the first ADC 102 may be suitable to enable fast provision of the M-bit digital values for the sub-ADCs 104a, 104b.

The second ADC 104 comprises time-interleaved sub-ADCs 104a, 104b. The second ADC 104 may be or may comprise a TI-ADC. Each of the sub-ADCs 104a, 104b of the second ADC 104 generates the sequences of B-bit digital values 105a, 105b on the basis of the one or more received M-bit digital values. By this, the second ADC 104 may provide a high-resolution digital output signal. Since each of the sub-ADCs 104a, 104b receives the at least M-Bit digital value from the first ADC 104 as a coarse input, the conversion period of each of the sub-ADC 104a, 104b can be shorter. Hence, each sub-ADC 104 may be able to start sampling and converting the input signal 101 with a higher sampling frequency compared to each of the sub-ADCs of a conventional TI-ADC not using a precomputed digital input with coarse resolution.

For example, the sub-ADCs 104a, 104b of the second ADC 104 are one of a successive-approximation ADC, a folding-ADC, a subranging ADC or a pipeline ADC. These ADC types may enable a power-efficient and accurate conversion of the input signal 101 based on the sequence of M-bit digital values 103. The sub-ADCs 104a, 104b of the second ADC 104 may need to be architecturally suited to be able to use the precomputed coarse (M-bit) decision offered by the first ADC 102 for their current input sample to speed up their internal conversion process of that particular input sample down to the final accuracy of the overall converter.

In the named sub-ADC types a partial decision can (e.g. immediately) be used to preset the internal circuit accordingly and continue the conversion from that particular starting point. In case the coarse stage of the sub-ADC type is already a fast-ADC, e.g. flash-ADC as coarse converter stage in a folding, subranging or pipeline ADC, the proposed technique may lead to power and area saving due to the sharing of the coarse conversion stage between the sub-ADCs 104a, 104b performing only the fine conversion step.

The value M of the M-bit digital value may determine the (e.g. first) resolution of the first ADC 102 and the value B of the B-bit digital value may determine the (e.g. second) resolution of each of the sub-ADCs 104a, 104b of the second ADC. With M<B, the resolution of the first ADC 102 is lower than the resolution of each of the sub-ADCs 104a, 104b.

The (e.g. analog) input signal 101 may be a radio frequency (RF) signal. The (analog) input signal 101 may be a continuous or sampled analog input signal. The sampled analog input signal may be the output of a S-H circuit further upstream of the first and second ADC 102, 104 to the apparatus 100 or in general to an analog frontend of the apparatus 100, e.g. in a hierarchical S-H architecture in a more highly interleaved TI-ADC (e.g. see examples related to FIGS. 7-10 depicting hierarchical systems based on the proposed technique).

Although not explicitly illustrated in FIG. 1, the apparatus 100 may comprise additional or optional circuitry (components). For example, the apparatus 100 may comprise further circuitries, e.g. determining a sign of the input signal 101 or generating another (e.g. M+1-bit) digital value, a buffer circuit, a combiner circuit, S-H circuits or a combination thereof. Some exemplary apparatuses showing further details of the proposed technique will be described in the following with reference to FIGS. 2 to 13.

Figure 2:
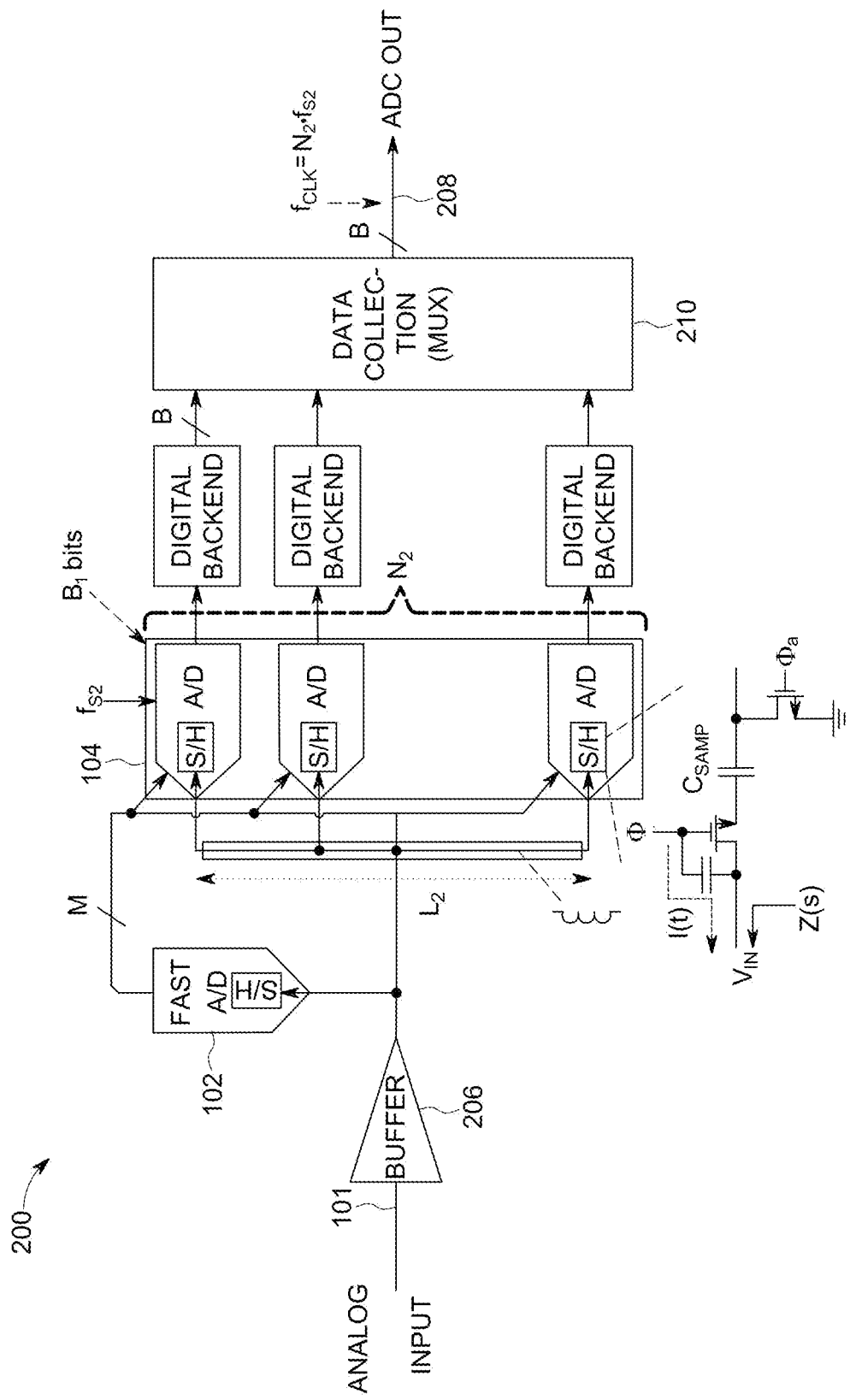
FIG. 2 illustrates another example of an apparatus for analog-to-digital conversion.
Figure 3:
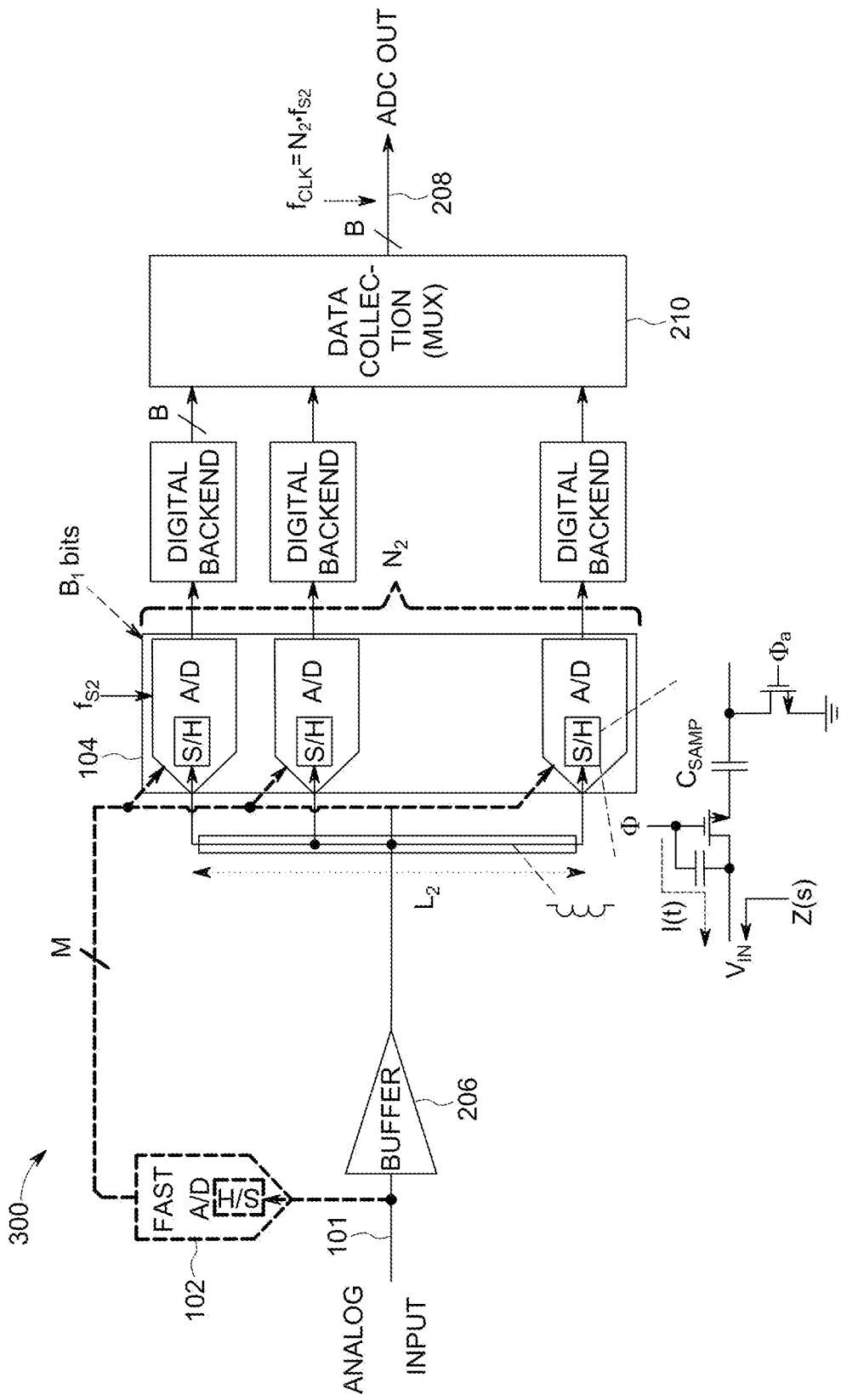
FIG. 3 illustrates another example of an apparatus for analog-to-digital conversion.

FIG. 2 illustrates another example of an apparatus 200. The implementation of the apparatus 200 may be similar to the implementation of the apparatus 100 described in connection with FIG. 1. The apparatus 200 comprises a buffer circuit 206 configured to buffer the input signal 101. According to the example in FIG. 2, an input of the first ADC 102 is coupled to an output of the buffer circuit 206. The buffer circuit 206 generates a buffered signal based on the (analog) input signal 101 for driving sample-and-hold stages of the first and second ADC 102, 104. Alternatively, the first ADC 102 may be also able to directly use the (unbuffered) input signal 101 for generating the sequence of M-bit digital values. Such an example of an apparatus 300 is depicted in FIG. 3. Therein, the input of the first ADC 102 is coupled to an input of the buffer circuit 206.

According to the illustrated examples in FIGS. 2-3, the first ADC 102 comprises a S-H circuit for generating samples of the input signal 101 according to a first sampling frequency. Each of the sub-ADCs comprises a S-H circuit for generating samples of the input signal 101 according to a second sampling frequency. For example, the first ADC is configured to sample the input signal 101 at the first sampling frequency $f_{S1}$ and one of the plurality of time-interleaved sub-ADCs is configured to sample the input signal 101 at the second sampling frequency $f_{S2}$ being lower than the first sampling frequency $f_{S1}$. Both the first ADC 102 and the second (time-interleaved) ADC 104 have (approximately) the same sampling rate. The second ADC 104 comprises a number of individual sub-ADCs configured as a time-interleaved ADC. The individual sub-ADCs do sample at a lower sampling rate (by the interleaving factor) than the first ADC 102. Accordingly, the aggregate time-interleaved second ADC 104 samples at the same rate as the fast first ADC 102. Due to the different sampling frequencies, the first (fast) ADC 102 may be able to provide the at least one M-bit digital value for each of the respective sub-ADCs successively such that the sub-ADCs can operate in a time-interleaved manner based on the received coarse information.

In the illustrated examples in FIG. 2-3 the second ADC 104 comprises $N_2$ sub-ADCs each receiving a sequence of M-bit digital values from the first ADC 102 and supplying a sequence of B-bit digital values based on the received sequence of the M-bit digital values. As illustrated in FIGS. 2-3, each sub-ADC (e.g. requiring a calibration step) uses a digital backend for correcting nonlinear INL-errors of the sub-ADC due to internal mismatches. If appropriate, the digital backend may also include correction for the non-ideal transfer function of the fast ADC 102, which would be common for all sub-ADCs inside the second ADC 104.

The apparatus 200, 300 further comprises a combiner circuit 210 configured to combine the sequences of B-bit digital values from the sub-ADCs to a digital output signal 208 at a sampling rate that is $N_2$ times (related to the interleaving factor) higher than the sampling rate of the individual sub-ADC. The combiner circuit 210 uses each of the respective sequences of B-bit digital values from the sub-ADCs to generate a B-bit digital output signal 208 corresponding to the (analog) input signal 101. Since the apparatus 200, 300 uses a plurality, in the particular example $N_2$, of time-interleaved sub-ADCs each having a sampling frequency $f_{S2}$, the overall sampling frequency of the apparatus is $f_{CLK}=N_2 \, f_{S2}$.

For example, the (S-H capacitor of the) first ADC 102 comprises a sampling capacitor with capacitance $C_{S,1}$ and (the S-H capacitor of the) at least one sub-ADC of the second ADC 104 comprises a sampling capacitor with capacitance $C_S$. The ratio of sampling capacitances $$\frac{C_{S,1}}{C_S}$$

may be equal to or higher than $$\left(\frac{2^M-1}{2^B-1}\right)^2.$$

Since M is smaller than B, the S-H circuit of the first ADC 102 does not have to comply with the dynamic range or linearity specification of the sub-ADCs and can therefore use a smaller sampling capacitor. Therefore, the extra loading on the output of the buffer circuit 206 due to the S-H circuit of the first ADC 102 may be very small. This may be also true for the required extra wiring to the input of the first ADC 102 since the first ADC 102 may be in close proximity of the buffer circuit 206. The size of $C_S$ of the sub-ADCs may be either limited by the targeted noise spectral density (noise power given by kT/C for a single capacitor C, i.e. single-ended representation), or by the targeted raw linearity (C-matching of fractions of $C_S$). Since high-speed ADCs typically employ calibration techniques, $C_S$ may be sized according to sampled noise (kT/C) considerations.

In terms of the ratio of sampling capacitances, one may consider the following:

Assuming the dimensioning of the S-H circuit is done based solely on sampling noise considerations, the sampled rms noise voltage in the sub-ADC may be (factor 2 for differential implementation):

$$v_{n,rms} = \sqrt{2 \cdot \frac{kT}{C_S}}$$

where $C_S$ is the (single-ended) sampling capacitor size in the sub-ADC. This (integrated) noise can be related to the Full-Scale of the A/D-converter, more precisely to the maximum amplitude of a sine wave input that does not clip (after digitization, i.e. in comparison with the ADC full-scale range), to calculate the resulting maximum signal-to-noise ratio (SNR) of the ADC, which is also called Dynamic Range. This may need to comply with the required noise specification target, since the sampling process might not be the only noise source in the converter system. Assume a (differential) Full-Scale of $V_{FS}$ (peak value of maximum differential no-clip sine wave=$0.5*V_{FS}$). One may need a maximum SNR consistent with B bits of quantization accuracy. The least significant bit (LSB)-size for B-bit resolution is $\Delta = V_{FS}/(2^B-1)$. The quantization "rms" noise (assuming statistical independence of input signal and quantization error) is $$v_{n,Q}^2 = \frac{\Delta^2}{12}.$$

It one assumes no margin and allows an overall maximum accuracy loss of 0.5 bits, i.e. the sampling noise may be the only noise source in the system besides the quantization noise, then these two can be directly compared:

$$v_{n,rms}^2 = 2 \cdot \frac{kT}{C_S} \le \frac{\Delta^2}{12} = \frac{1}{12} \cdot \frac{V_{FS}^2}{(2^B - 1)^2} \rightarrow C_S \ge \frac{2kT \cdot 12 \cdot (2^B - 1)^2}{V_{FS}^2}$$

Since the fast ADC may need to resolve only M<B bits, by the same (no-margin) argument its sampling capacitor $C_{S,1}$ may have at a minimum the size:

$$C_{S,1} \ge \frac{2kT \cdot 12 \cdot (2^M - 1)^2}{V_{FS}^2}$$

Thus the minimum ratio of required sampling capacitances (for the same Full-Scale) may become:

$$\frac{C_{S,1}}{C_S} = \left(\frac{2^M - 1}{2^B - 1}\right)^2 \approx 2^{2(M-B)}$$

For example: B=10 bit, M=4. Hence $C_{S,1}$ of the fast ADC could in theory be $2^{12}$=4096× smaller for the same Full-Scale value and the same noise margin.

Given the quadratic nature of the minimum theoretical C-ratio, even with a considerable sampling noise margin the fast-ADC can use a significantly smaller sampling capacitor than the much more accurate sub-ADC. For example, one may scale $C_{S,1}$ by at least a factor 8 or more, at which point it might not generate any significant excess loading for the driving stage.

FIGS. 2-3 show a hybrid-ADC architecture for the time-interleaved ADC with front-end buffer circuit 206 and analog distribution network. In FIG. 2 the (fast) first ADC 102 is connected directly to the output of the buffer circuit 206. It has a dedicated S-H circuit that samples the buffer output along with one of the sub-ADCs in the TI-ADC-array. A capacitor circuit for the S-H circuit of one of the sub-ADCs is given in FIGS. 2-3 only by way of example.

Figure 4:
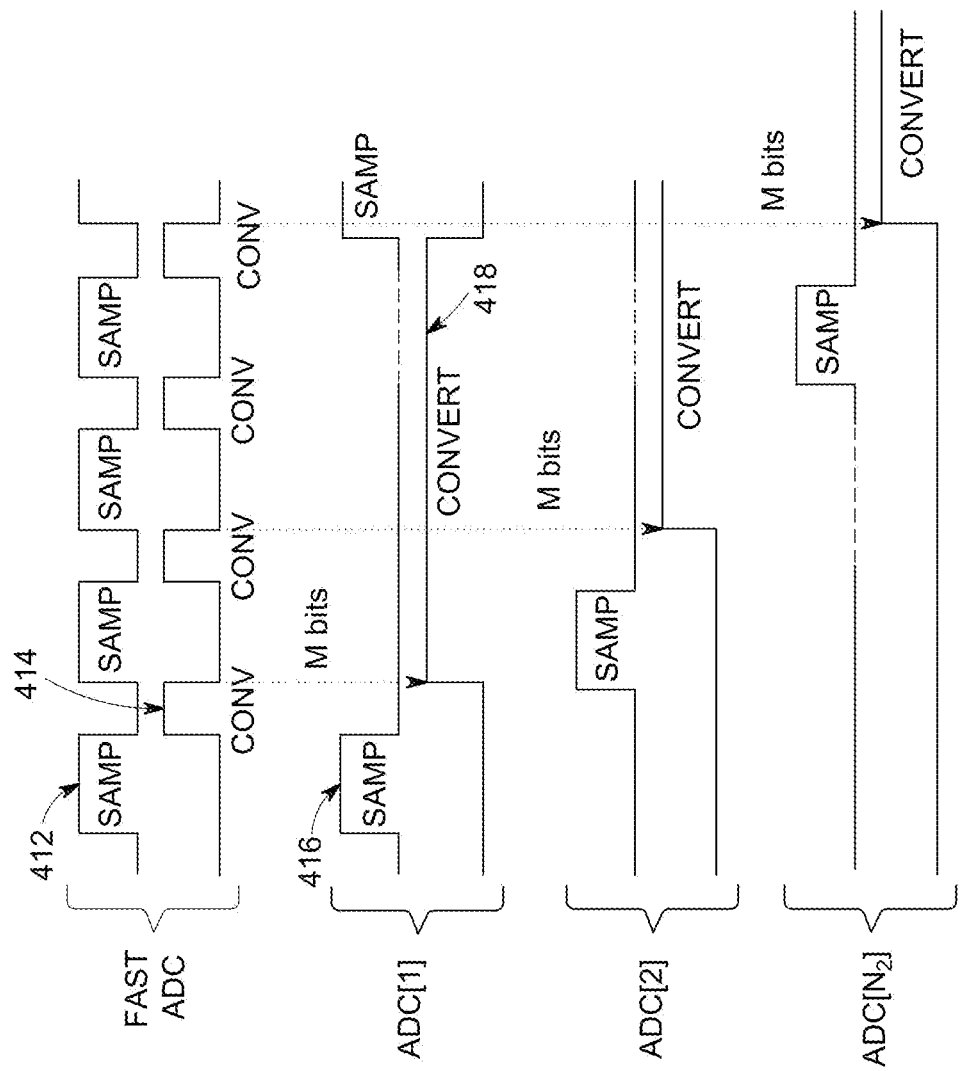
FIG. 4 illustrates an example for a timing related to the apparatus of FIG. 2 or FIG. 3.

FIG. 4 shows an example for a timing with respect to sampling periods and conversion periods related to the apparatus of FIGS. 2-3. The first ADC (referred by fast ADC) samples the input signal with the first sampling frequency being higher than the sampling frequency of each of the sub-ADCs (referred by ADC[1], ADC[2], . . . , ADC[$N_2$]). After sampling the input signal (by the first ADC), the first ADC starts converting the sample and provides the M-bit digital value (being a coarse information) to the sub-ADC. For example, the first ADC performs a fast and coarse conversion immediately after the end of the first sampling period. The respective sub-ADC that has sampled the buffer output along with the first ADC may wait for the first ADC until it completes its conversion cycle. Then, it can use the M precomputed bits from the first ADC as an initial decision and can continue on the conversion to the final accuracy. Since the fast-ADC is shared between the $N_2$ time-interleaved sub-ADCs, the precomputed decision on the current input sample is distributed to all sub-ADCs (M-bit bus).

As described above, the first ADC is configured to sample the input signal during the first sampling period 412. One of the plurality of time-interleaved sub-ADCs is configured to sample the input signal during a second sampling period 416. As shown in FIG. 4, an end of the first sampling period 412 is equal to an end of the second sampling period 416. The second sampling period 416 is equal or longer than the first sampling period 412. If the first and sampling periods 412, 416 are equal, sampling, e.g. a first sample, by the first ADC may start and end at the same time with respect to the sampling by the respective sub-ADC.

The (e.g. front-end) sampling process related to the first ADC may need to be able to accommodate the fast-ADC conversion process. If the second sampling period 416 is longer than the first sampling period 412, the first ADC may start sampling later than the sub-ADC sampling the respective sub-ADC. For this implementation, the first ADC may exploit the residual (unused sampling) time for converting the respective sample. In other words, the resulting loss in sampling period in the sub-ADCs can in part be compensated for by allowing a small overlap in the beginning of the sampling period. The first ADC can start sampling with a (small) delay compared to the sub-ADC such that the conversion period of the first ADC can be extended by this delay. Since the first ADC may only require limited accuracy, the shortening of the fast-ADC sampling period 412 might be not relevant.

As described above, after sampling conversion of the samples can take place. The first ADC is configured to convert a first sample obtained by sampling the input signal during the first sampling period 412 to one of the sequence of M-bit digital values during a first conversion period 414. The one of the plurality of time-interleaved sub-ADCs is configured to convert a second sample obtained by sampling the input signal during the second sampling period 416 to one of the sequence of B-bit digital values during a second conversion period 418 being longer than the first conversion period 414. For example, the second conversion period 418 is at least three times the first conversion period 414. Due to the shorter conversion period 414 of the first ADC the coarse M-bit digital value can be provided to the respective sub-ADC in a fast manner. Based on the received M-bit digital value, the sub-ADC can convert the respective sample with a longer (second) conversion period 418 (compared to the first conversion period 414), for a better accuracy. According to the proposed technique, the second conversion period 418 may be shorter than the conversion period of conventional sub-ADCs not using the coarse M-bit digital value. Hence, the sub-ADCs can be ready to operate (or sample and convert) earlier on the next sample of the input signal. Accordingly, less sub-ADCs may be needed for achieving the target sampling rate and the desired accuracy.

In other words, the proposed hybrid time-interleaved ADC architecture may result in a speedup in each sub-ADC conversion, because the M-bit digital values (e.g. with M being 2, 3, 4, 5, 6 or higher if needed) might not need to be resolved inside the sub-ADC. Each sub-ADC can therefore be run at an increased net sampling frequency $f_{S2} > f_{S1}$ (with $f_{S1}$ referring to the sampling frequency of sub-ADCs in a conventional apparatus for analog-to-digital conversion), such that the required number of sub-ADCs can be reduced ($N_2 < N_1$ with $N_1$ referring to the number of sub-ADCs in a conventional apparatus for analog-to-digital conversion). This in turn can make the apparatus (or second ADC or both)

more compact (e.g. less silicon area). For example, it may reduce the vertical dimension of the analog distribution network ($L_2 < L_1$ with $L_1$ being the vertical dimension in a conventional apparatus for analog-to-digital conversion). Accordingly, the buffer circuit may only need to drive a simpler network (of smaller physical dimension) with less taps. Further, there may be a net improvement in the power dissipation of the apparatus (or second ADC) since the digital backend may become more compact and the sub-ADC correction may be done for less sub-ADCs. As described above, the first ADC may be a power efficient time-based flash ADC which may additionally improve the power dissipation of the apparatus.

More details and aspects are mentioned in connection with the examples described above or below. The example shown in FIGS. 2-3 (in connection with FIG. 4) may comprise one or more optional additional features corresponding to one or more aspects mentioned in connection with the proposed technique or one or more examples described above (e.g. FIG. 1) or below (e.g. FIGS. 5-13).

Figure 5:
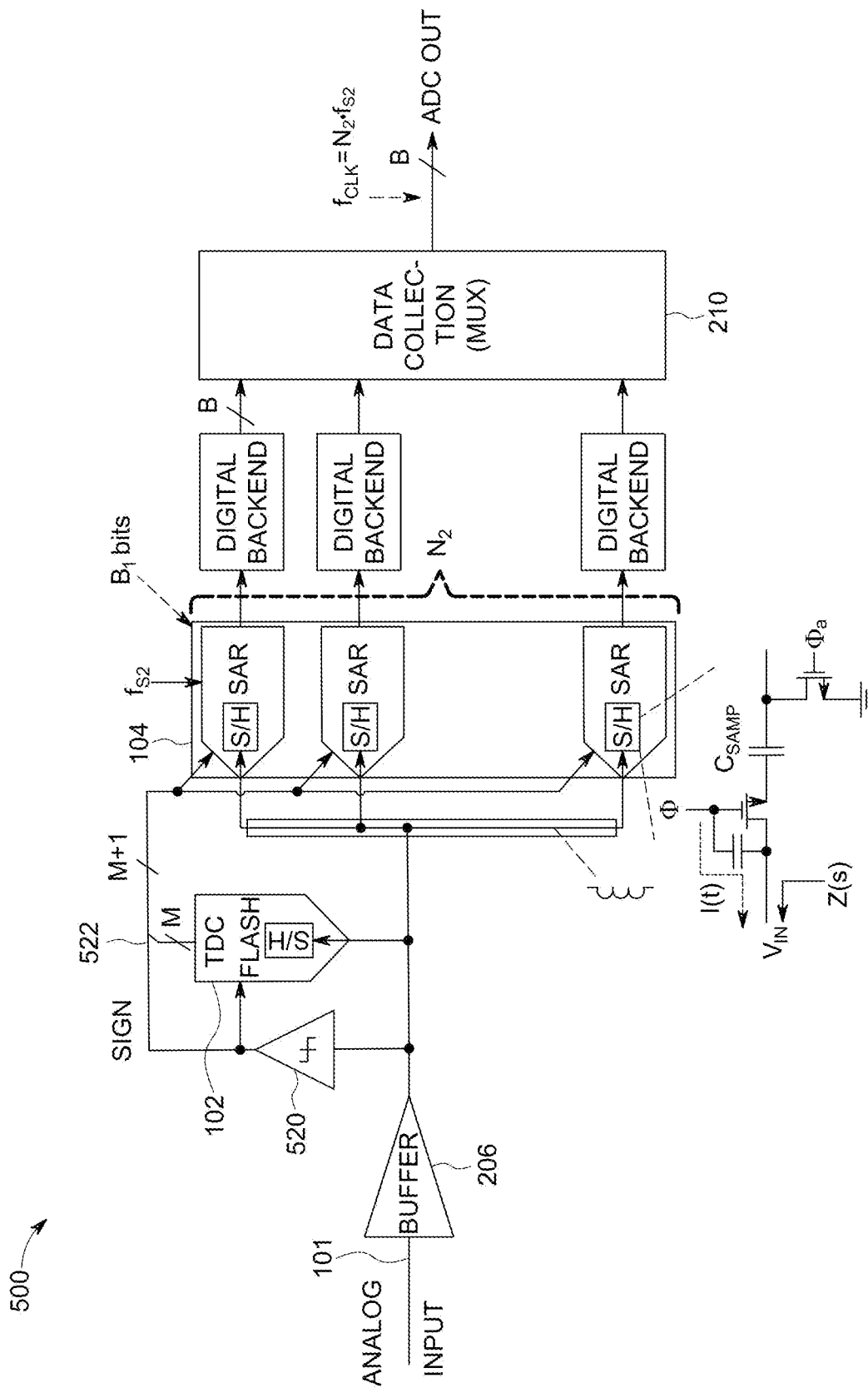
FIG. 5 illustrates another example of an apparatus for analog-to-digital conversion.

FIG. 5 shows another example of an apparatus 500. The implementation of the apparatus 500 may be similar to the implementation of the apparatus 100, 200, 300 described in connection with FIGS. 1-4. The apparatus 500 further comprises circuitry 520 configured to receive the input signal 101 and determine a sign of the input signal 101 and to supply a sequence of 1-bit digital values. The apparatus 500 further comprises circuitry 522 configured to generate a sequence of M+1-bit digital values being based on the sequence of M-bit digital values and the sequence of the 1-bit digital values. The first ADC 102 is configured to use the sequence of 1-bit digital values to convert the input signal 101 to the sequence of M-bit digital values. Each sub-ADC is configured to receive at least one M+1-bit digital value of the sequence of M+1-bit digital values. Further, each sub-ADC is configured to convert the input signal 101 to the respective sequence of B-bit digital values using the at least one M+1-bit digital value of the sequence of M+1-bit digital values.

The circuitry 520 may determine (e.g. by thresholding) an additional information on the sign of the input signal 101. This information can be determined prior to the conversion (of the respective sample) by the first ADC 102 and the sub-ADCs. The information on sign may be provided by the circuitry 520 by the 1-bit digital value. Due to prior determination, the 1-bit digital value can be used by each of the first ADC 520 and the respective sub-ADC. The circuitry 522 can combine the 1-bit digital value referring to the sign of the sample and the M-bit digital value from the first ADC 102 to provide a M+1-bit digital value for the sub-ADCs. Compared to the proposed examples described above, both the first ADC 102 and the sub-ADCs of the second ADC 104 receives additional information (based on the 1-bit digital value) on the input signal 101. For this implementation, the conversion period for the first ADC 102, each of the sub-ADCs or both can be further reduced. Accordingly, the net frequency of the sub-ADC can be further increased and, e.g. the number of required sub-ADCs can be reduced.

In other words, the proposed apparatus of FIG. 5 employs a sign-prediction during the sampling period combined with a time-based flash-ADC which may start its conversion after the end of the sampling period (e.g. coinciding with the end of the sampling period of the sub-ADCs). The first ADC 102 may use the predetermined sign for its own conversion process. The apparatus can profit (e.g. in terms of possible architectural simplifications and/or speedup of the internal conversion process) from the knowledge of the sign of the taken voltage sample.

Figure 6:
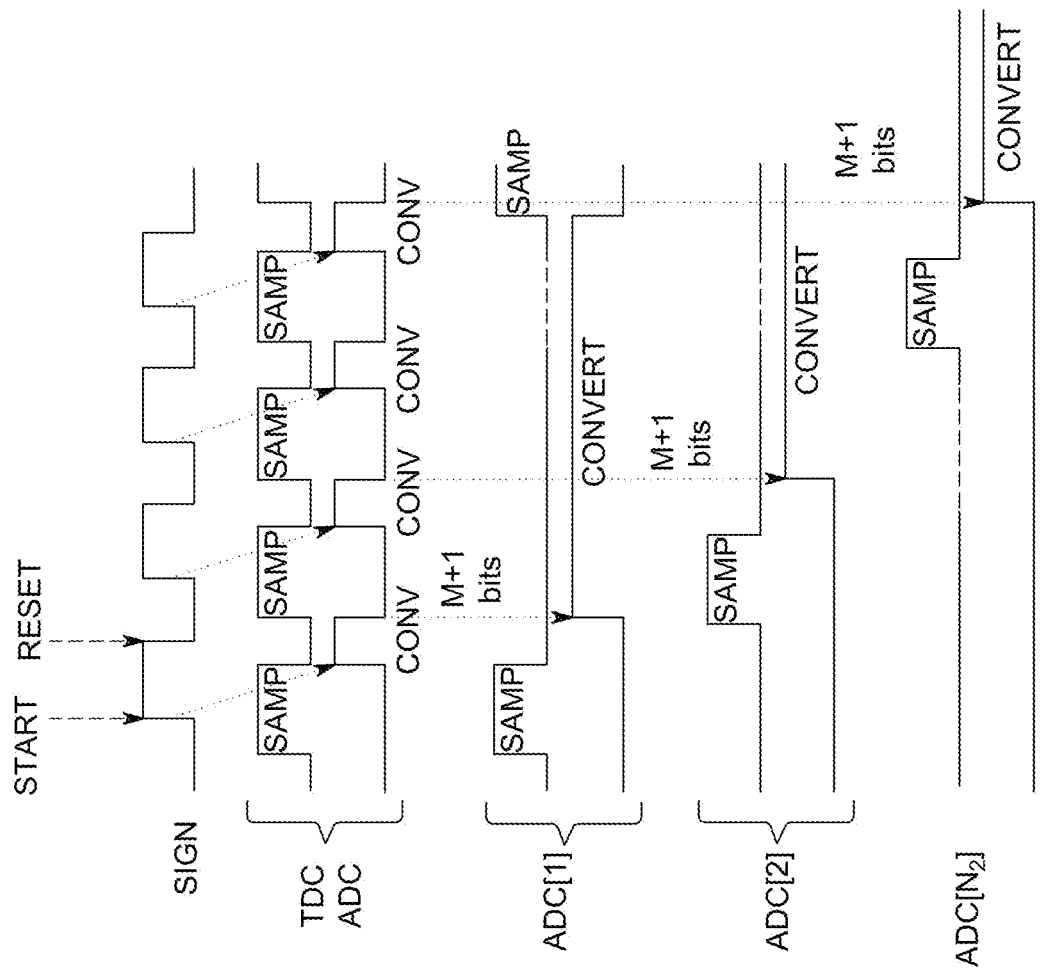
FIG. 6 illustrates an example for a timing related to the apparatus of FIG. 5.

FIG. 6 shows an example for a timing with respect to sampling periods and conversion periods related to the apparatus of FIG. 5. As indicated, the sign-prediction for each input sample can be taken during the sampling period. The sign-prediction can be used by the first ADC (referred by TDC ADC) for the coarse decision with M-bit accuracy. With the 1-bit digital value received from the circuitry 520, a M+1-bit digital value can be provided for the sub-ADCs. Hence, the overall M+1-bit coarse decision can be passed to the sub-ADC responsible for the final conversion of the current input sample.

More details and aspects are mentioned in connection with the examples described above or below. The example shown in FIG. 5 (in connection with FIG. 6) may comprise one or more optional additional features corresponding to one or more aspects mentioned in connection with the proposed technique or one or more examples described above (e.g. FIGS. 1-4) or below (e.g. FIGS. 7-13).

Figure 7:
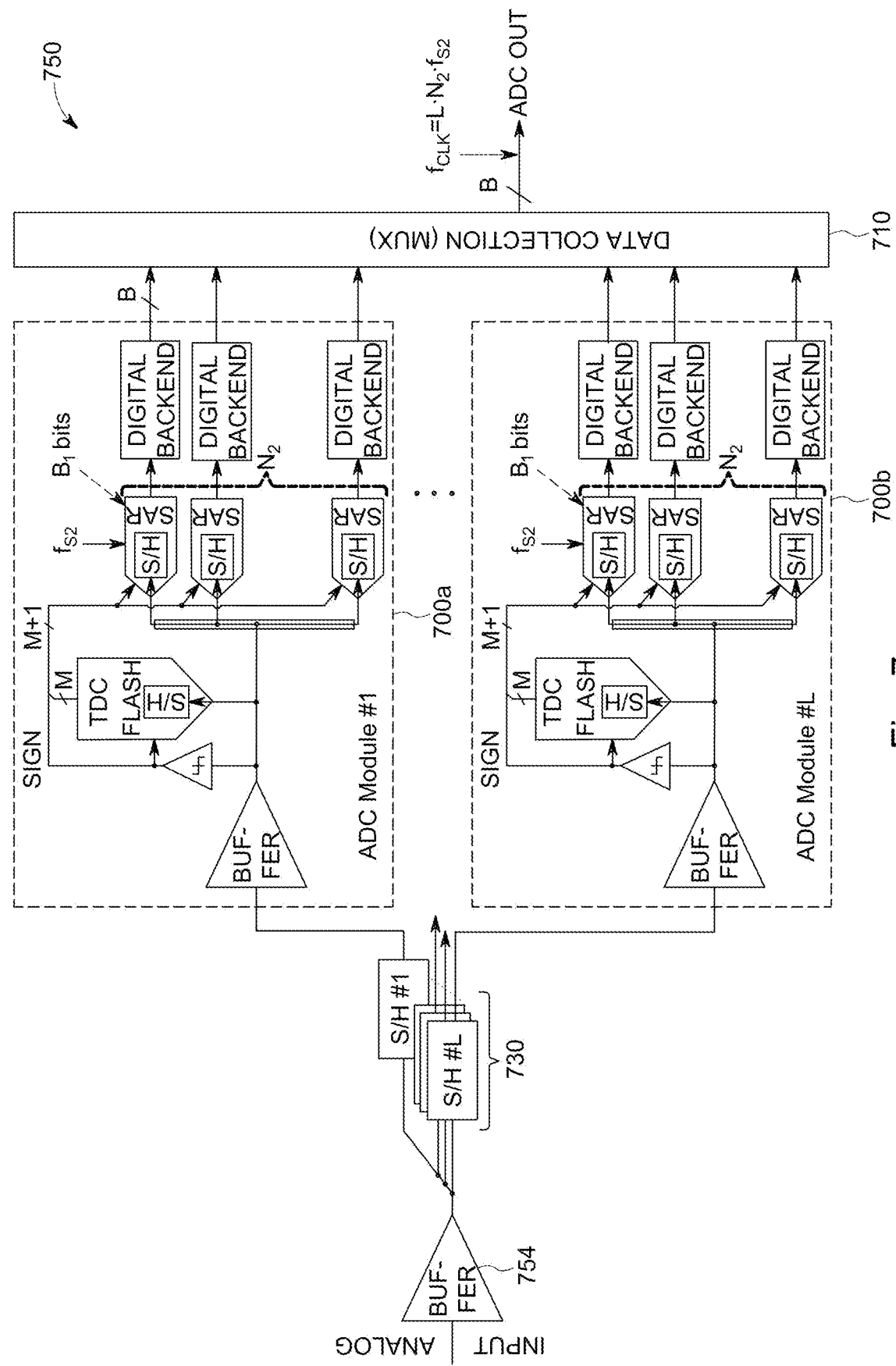
FIG. 7 illustrates an example of a system for analog-to-digital conversion.
Figures 1, 8:
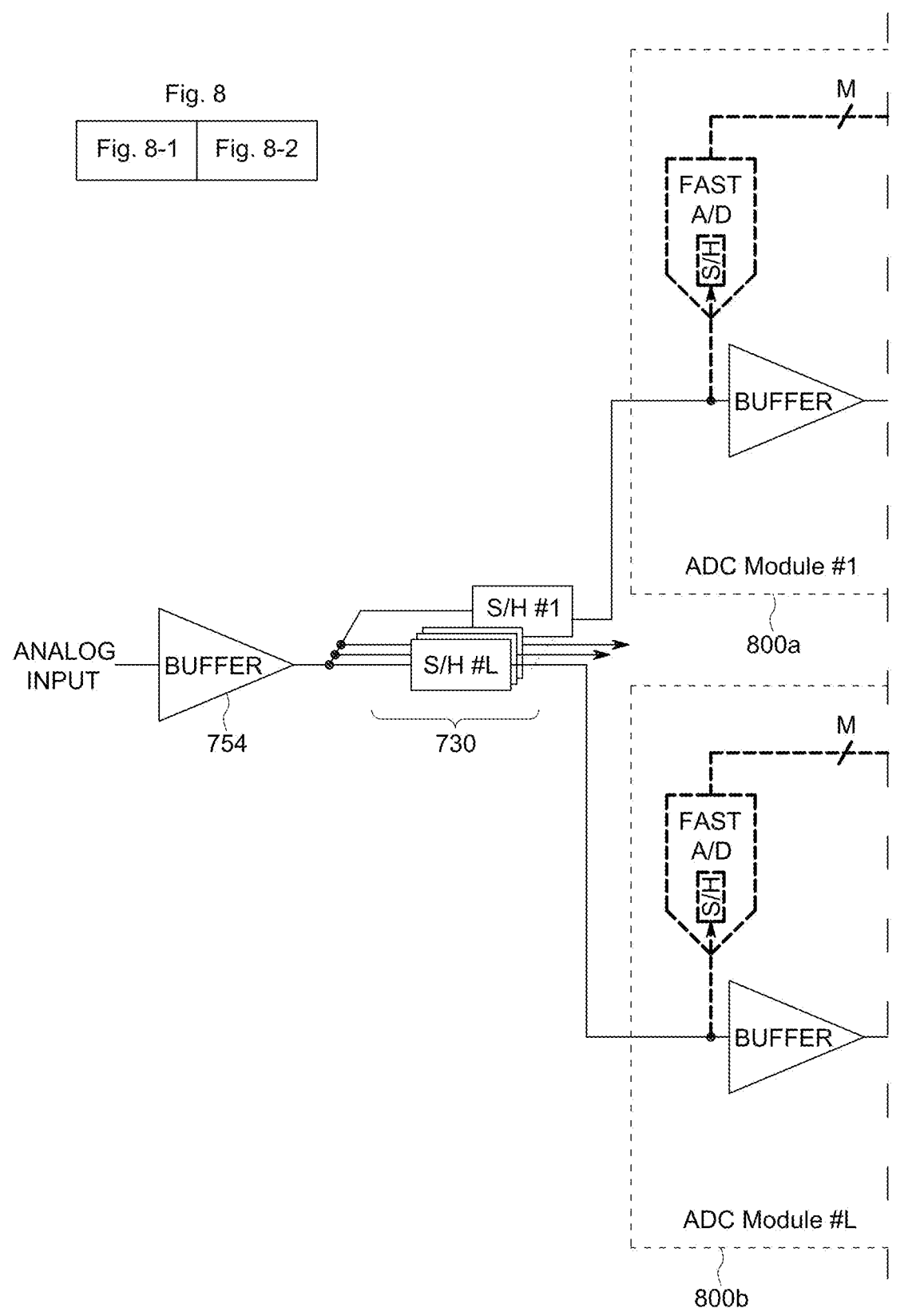
FIG. 8 illustrates another example of a system for analog-to-digital conversion.
Figures 2, 8:
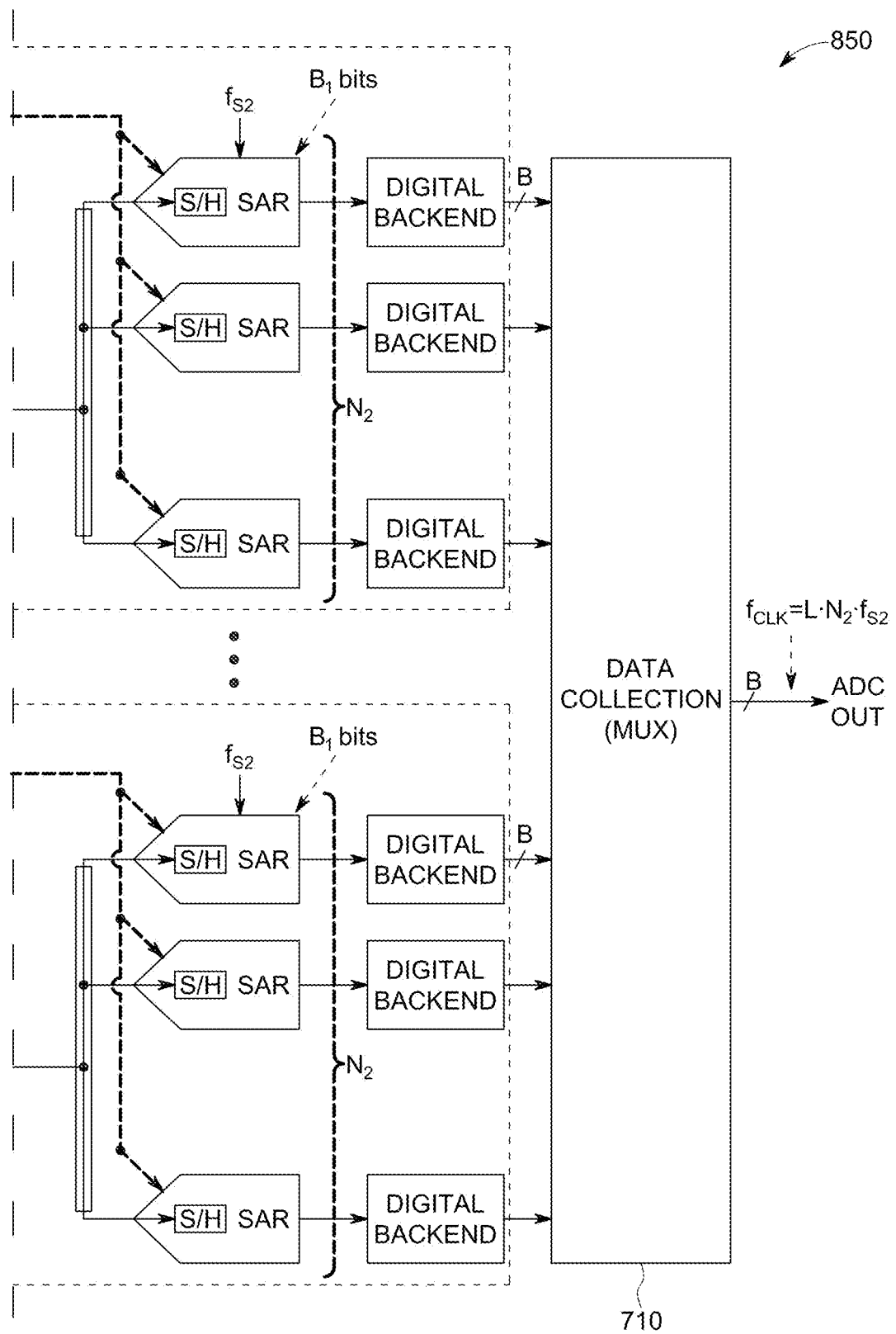

FIG. 7 illustrates an example of a system 750. Similarly, FIG. 8 illustrates another example of a system 850. The system 750 in FIG. 7 comprises a plurality of apparatuses 700a, 700b etc. for analog-to-digital conversion (in the particular example based on the apparatus 500 described in connection with FIG. 5 without combiner circuit 210). The system 850 in FIG. 8 comprises a plurality of apparatuses 800a, 800b etc. for analog-to-digital conversion (in the particular example based on the apparatus 300 described in connection with FIG. 3 without combiner circuit 210). According to another example, the system may comprise (or may be based on) a plurality of apparatuses for analog-to-digital conversion according to any of the proposed apparatuses (e.g. apparatus 100 or 200) or aspects described in conjunction with FIG. 1-4.

The system 750, 850 comprises a (common) combiner circuit 752 configured to combine the sequences of B-bit digital values by the sub-ADCs of the plurality of apparatuses 700a-b, 800a-b for analog-to-digital conversion to a digital output signal. The plurality of apparatuses 700a-b, 800a-b might not need an (internal) combiner circuit since the common combiner circuit 710 is used for providing the corresponding output signal for the input signal. The plurality of apparatuses 700a-b, 800a-b based on the proposed technique can be used in a hierarchical architecture. The hierarchical architecture may increase the data throughput and the overall sampling rate. Hence, (a part of) the proposed apparatuses 700a-b, 800a-b can be embedded as sub-ADC modules in a hierarchical sampling TI-ADC.

The system 750, 850 further comprises a common buffer circuit 754 being upstream of the plurality of apparatuses 700a-b, 800a-b for analog-to-digital conversion and configured to receive the input signal and output a buffered input signal. In other words, an output of the common buffer circuit 754 is coupled, e.g. directly or via S-H circuits, to the inputs of the apparatuses 700a-b, 800a-b for analog-to-digital conversion. Hence, the apparatuses 700a-b, 800a-b for analog-to-digital conversion are able to receive the buffered input signal from the common buffer circuit 754.

The system 750, 850 further comprises a plurality of sample and hold circuits, S-H circuits, 730 for the plurality of apparatuses 700a-b, 800a-b for analog-to-digital conversion. Each of the plurality of S-H circuits 730 is coupled to an output of the common buffer circuit 754 to receive the buffered input signal and is coupled to an input of a respective one of the plurality of apparatuses 700a-b, 800a-b for analog-to-digital conversion. As shown in the example, each of the apparatuses 700a-b, 800a-b for analog-to-digital conversion may be able to couple to and use the outputs of S-H circuits and operate with the sampled signals. Due to the hierarchical architecture, a higher overall sampling rate can be achieved. Hence, FIGS. 7-8 show a two-level hierarchical sample and hold operation. Since a common buffer circuit 754 is implemented, each sub-ADC module 700a-b, 800a-b has a second-level buffer driving the, e.g. $N_2$, sub-ADCs in each module and is served by one of the, e.g. L, front-end S/H circuits. With L sub-ADC modules 700a-b, 800a-b each running at $N_2 \cdot f_{S2}$ the maximum sampling rate of the overall TI-ADC (with all sub-ADC modules 700a-b, 800a-b active) can be $f_{CLK} = L \cdot N_2 \cdot f_{S2}$. As a side-effect, the proposed hierarchical implementation (or other hierarchical implementations described below) may allow to operate the TI-ADC efficiently at lower sampling rates, e.g. multiples of $N_2 \cdot f_S$, by switching off entire sub-ADC module branches.

More details and aspects are mentioned in connection with the examples described above or below. The example shown in FIGS. 7-8 may comprise one or more optional additional features corresponding to one or more aspects mentioned in connection with the proposed technique or one or more examples described above (e.g. FIGS. 1-6) or below (e.g. FIGS. 9-13).

Figures 1, 9:
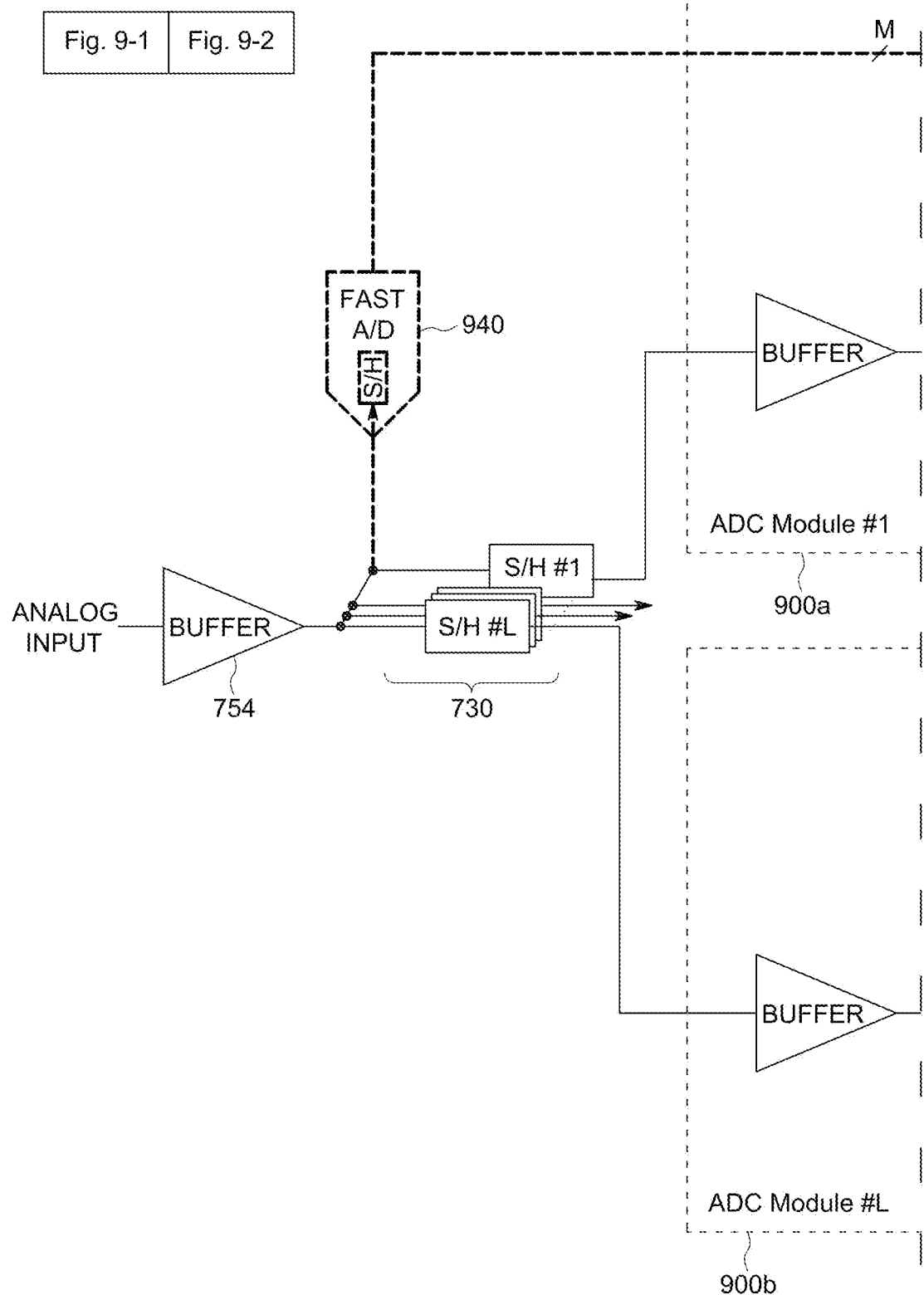
FIG. 9 illustrates another example of a system for analog-to-digital conversion.
Figures 2, 9:
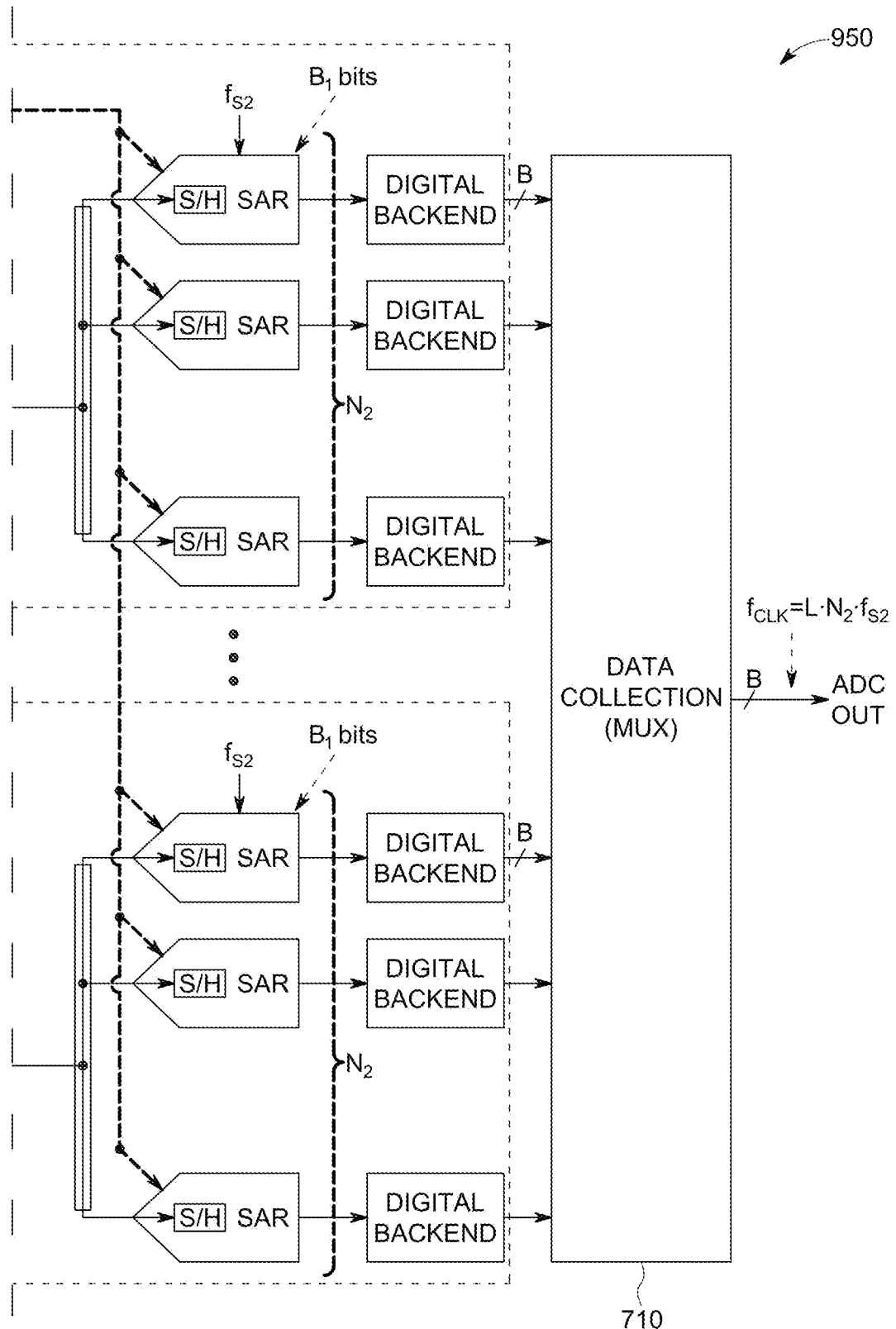

FIG. 9 illustrates another example of a system 950. The implementation of the system 950 may be similar to the implementation of the system 750, 850 based on the proposed techniques for analog-to-digital conversion described in connection with FIGS. 1-8. Compared to the systems 750, 850 described in connection with FIG. 7-8, a common first ADC 940 is used rather than the first ADC of each of the hierarchically arranged (part of) apparatuses.

Hence, the system 950 for analog-to-digital conversion comprises a (common) first analog-to-digital converter, ADC, configured to receive an input signal and convert the input signal to a sequence of M-bit digital values. The system 950 further comprises a plurality of apparatuses 900a-b for analog-to-digital conversion, each comprising a second ADC comprising a plurality of time-interleaved sub-ADCs each being configured to receive the input signal and at least one M-bit digital value of the sequence of M-bit digital values. Further, each sub-ADC is configured to convert the input signal to a respective sequence of B-bit digital values using the at least one M-bit digital value of the sequence of M-bit digital values. M and B are integers with M<B. The system 950 further comprises a combiner circuit 710 configured to combine the sequences of B-bit digital values by the sub-ADCs of the plurality of apparatuses for analog-to-digital conversion to a digital output signal. The proposed system 950 may need less first ADCs since using the (common) first ADC 940 may be sufficient enough. Accordingly, power efficiency and (physical) space requirements can be reduced.

The system 950 (optionally) further comprises a common buffer circuit 754 being upstream of the plurality of apparatuses 900a-b for analog-to-digital conversion. In other words, the output of the common buffer circuit 754 is coupled to the input of the apparatuses 900a-b for analog-to-digital conversion. The common buffer circuit 754 is configured to receive the input signal and output a buffered input signal for each apparatus of the plurality of apparatuses 900a-b.

Figures 1, 10:
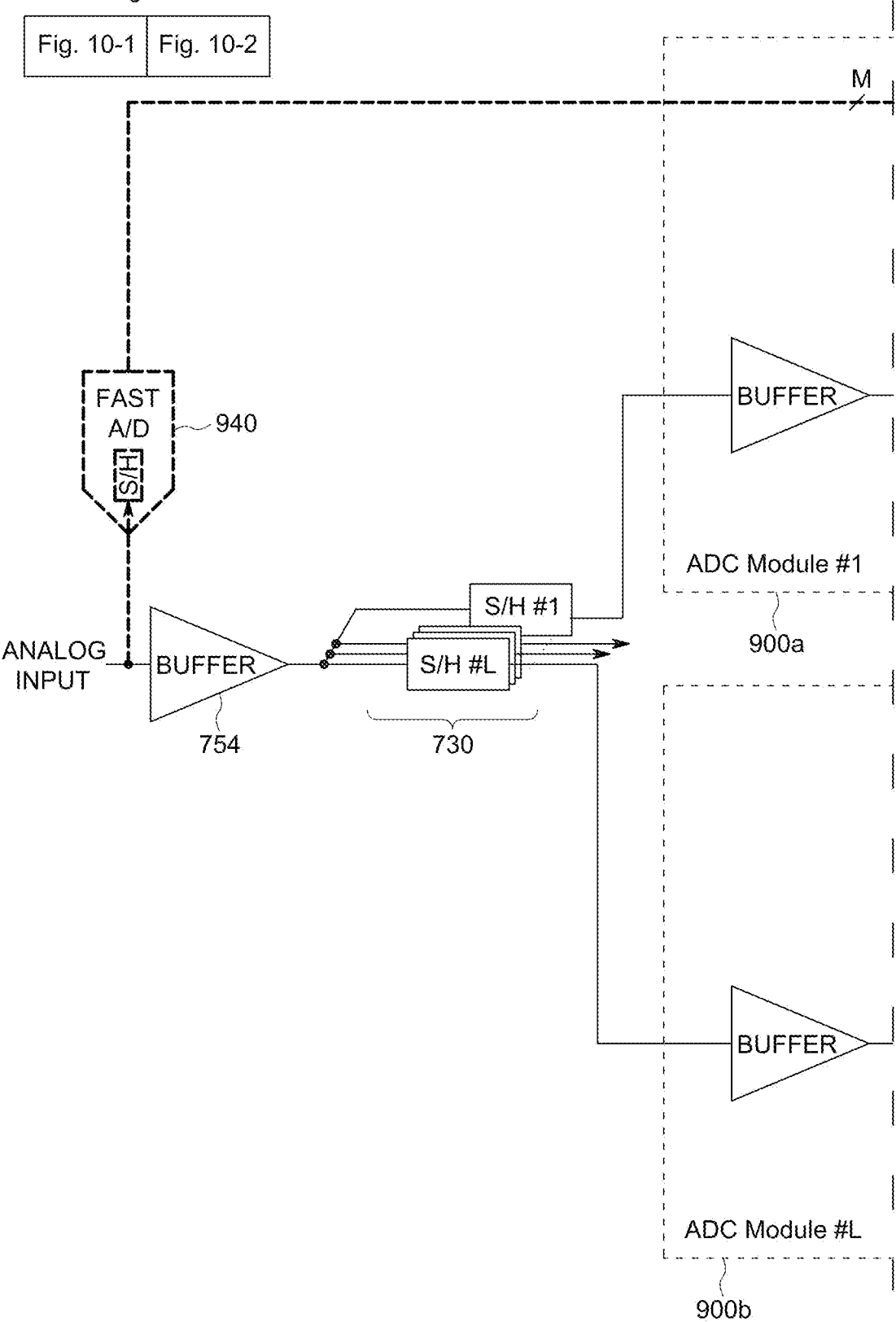
FIG. 10 illustrates another example of a system for analog-to-digital conversion.
Figures 2, 10:
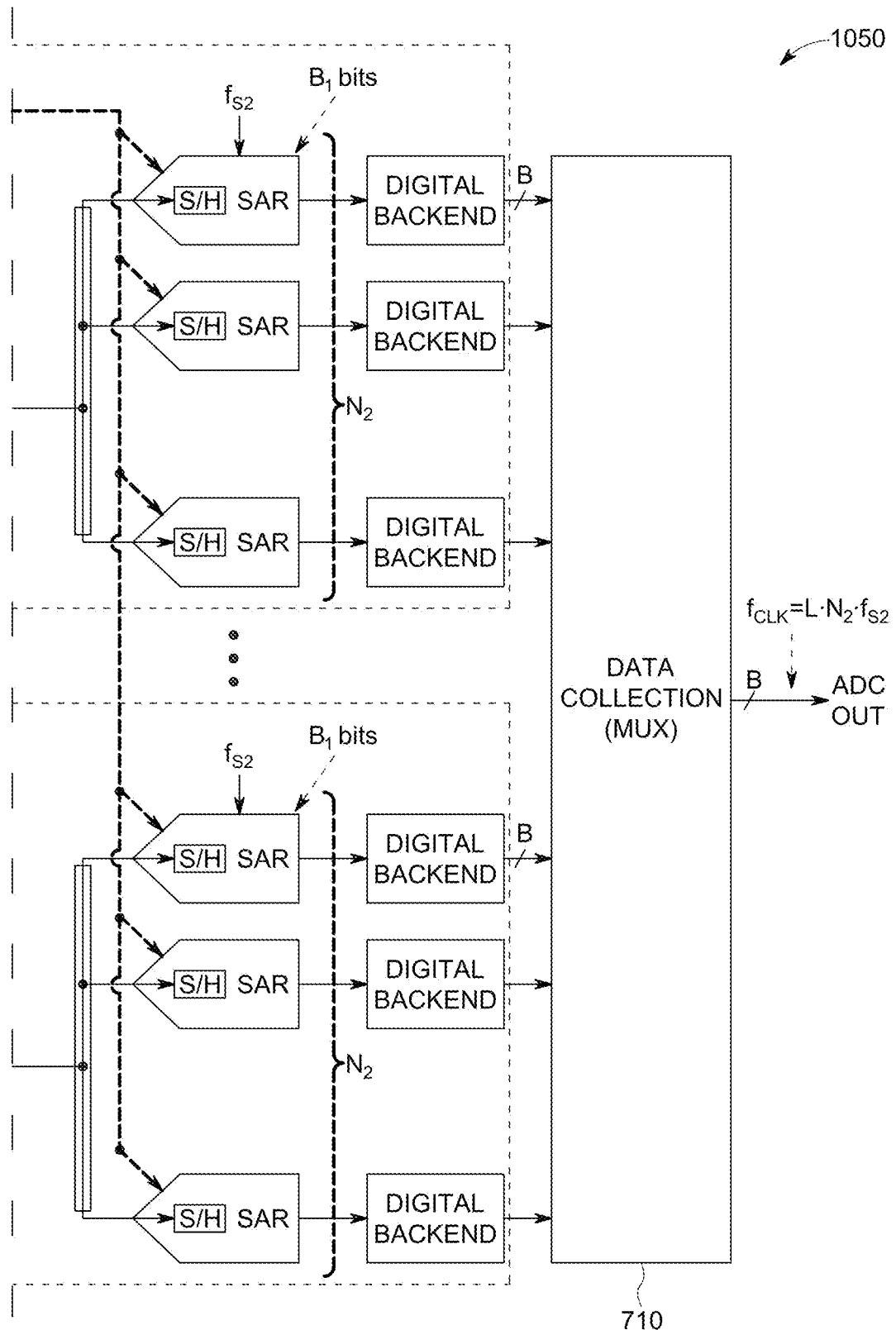

According to another example of a system 1050 depicted in FIG. 10, the (common) first ADC 940 is coupled to an input of the common buffer 754. Hence, the (common) first ADC 940 is able to receive and use the unbuffered input signal. For example, the (analog) input signal could be the output of a sample-and-hold circuit. The system 1050 could be one sub-ADC in a hierarchical sampling time-interleaved ADC with e.g. three (or more) levels of sampling to be able to reach an even higher overall sampling rate.

The systems 950, 1050 in FIGS. 9-10 further comprises (optionally) a plurality of sample and hold circuits, S-H circuits, 730 for the plurality of apparatuses 900a-b. Each S-H circuit of the plurality of S-H circuits 730 is coupled to an output of the common buffer circuit 754 to receive the buffered input signal and is coupled to a respective input of one of the plurality of apparatuses 900a-b. According to the example in FIG. 9, the (common) first ADC 940 is coupled to an output of the common buffer circuit 754 and to the inputs of the plurality of S-H circuits 730.

Some examples based on the proposed technique relate to a hybrid time-interleaved ADC module. As described, the proposed technique may reduce the required number of sub-ADCs in a time-interleaved ADC by introducing a fast frontend-ADC, e.g. directly connected to the ADC input buffer. The fast-ADC may sample the buffer output or input along with one of the sub-ADCs in the time-interleaved ADC-array. The first ADC may perform a coarse (M-bit) and fast conversion (e.g. immediately) after the end of the sampling period. The precomputed M-bit decision can be passed along to the sub-ADCs, and the sub-ADC (being responsible for the conversion of the corresponding input sample) can use it to speed up its internal conversion process.

Due to the possibly lower number of sub-ADCs, the proposed technique may lead to a reduced number of error sources that may need to be corrected. The smaller physical distance between sub-ADCs at opposite ends of the array may lead to decreased mismatch (gain and timing skew) and may require a less complex infrastructure to correct for these errors. Hence, a reduced amount of digital processing may be needed. Hence, area requirement and power dissipation can be reduced.

In some examples, the clock distribution network to the sub-ADCs may become small, reducing the overall power dissipation of the time-interleaved converter due to the reduced distance the clocking network has to cover.

In some examples, data from all the sub-ADCs are collected and postprocessed (e.g. multiplexed) to construct the output data stream of the time-interleaved ADC. Due to the physical distances in a smaller sub-ADC array (small $N_2 < N_1$), a decrease in power dissipation also in the digital backend of the time-interleaved ADC may result.

In some examples, the analog distribution network may become small. The smaller distances from buffer output to sub-ADC inputs may be associated with reduced inductance, which may be easier to drive and may reduce the power dissipation in the front-end buffer.

Figure 11:
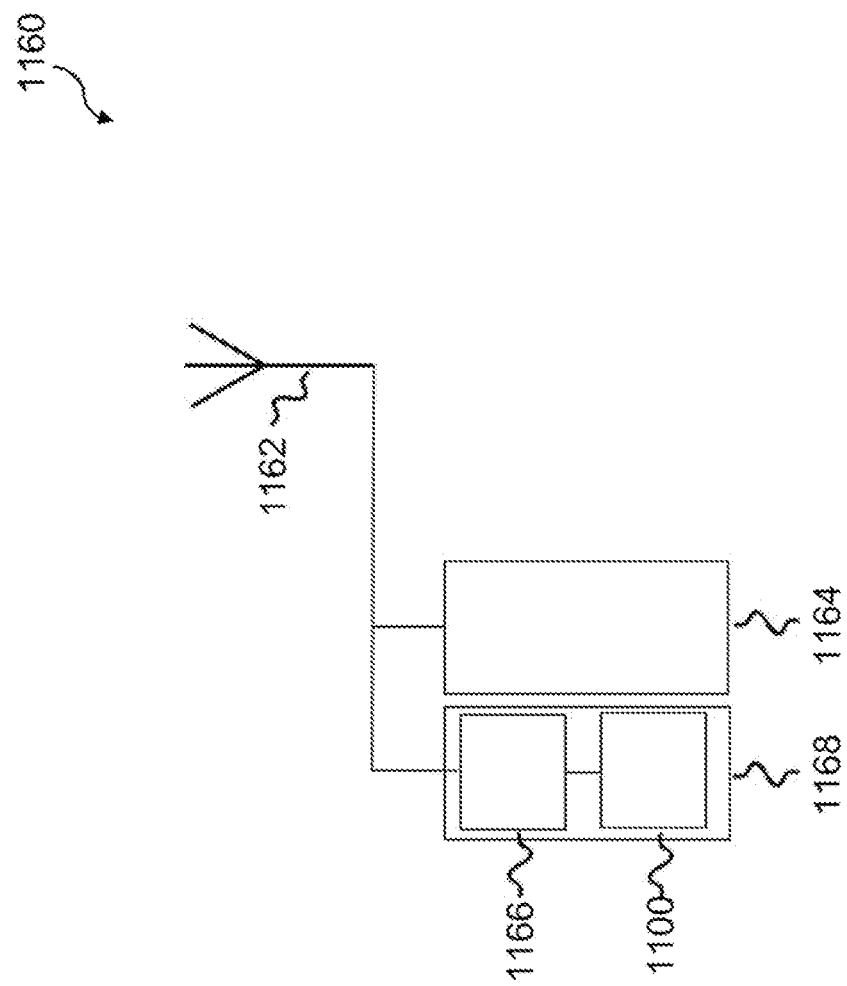
FIG. 11 illustrates an example of a base station.

An example of an implementation using analog-digital conversion according to one or more aspects of proposed apparatuses or systems described above in connection with FIGS. 1 to 10 or one or more examples described above in connection with FIGS. 1 to 10 is illustrated in FIG. 11.

FIG. 11 schematically illustrates an example of a radio base station 1160 (e.g. for a femtocell, a picocell, a microcell or a macrocell) comprising an apparatus (or alternatively a system described in context with FIGS. 7-10) 1100 as proposed. A receiver 1168 of the base station 1160 comprises the apparatus (or system) 1100. The receiver 1168 additionally comprises analog circuitry 1166 configured to receive a RF receive signal from at least one antenna element 1162 of the base station 1160. The analog circuitry 1166 is further configured to supply the input signal to the apparatus (or system) 1100 based on the RF receive signal. The apparatus (or system) 1100 generates digital data based on the input signal. For example, the analog circuitry 1166 may be an analog RF front-end and comprising one or more of a Low-Noise Amplifier (LNA), filter, a down-conversion mixer, Electro Static Discharge (ESD) protection circuitry, an attenuator etc. Further, the base station 1160 comprises a transmitter 1164 configured to generate a RF transmit signal. The transmitter 1164 may use the antenna element 1162 or another antenna element (not illustrated) of the base station 1160 for radiating the RF transmit signal to the environment.

To this end, a base station with improved analog-to-digital conversion capabilities may be provided.

The base station 1160 may comprise further elements such as, e.g., an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I2C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Inter-face Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more back-up power sources such as a battery or capacitor. Power alarm detection circuitry may detect one or more of brown out (under-voltage) and surge (over-voltage) conditions.

In some aspects, the power tee circuitry may provide for electrical power drawn from a net work cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 12:
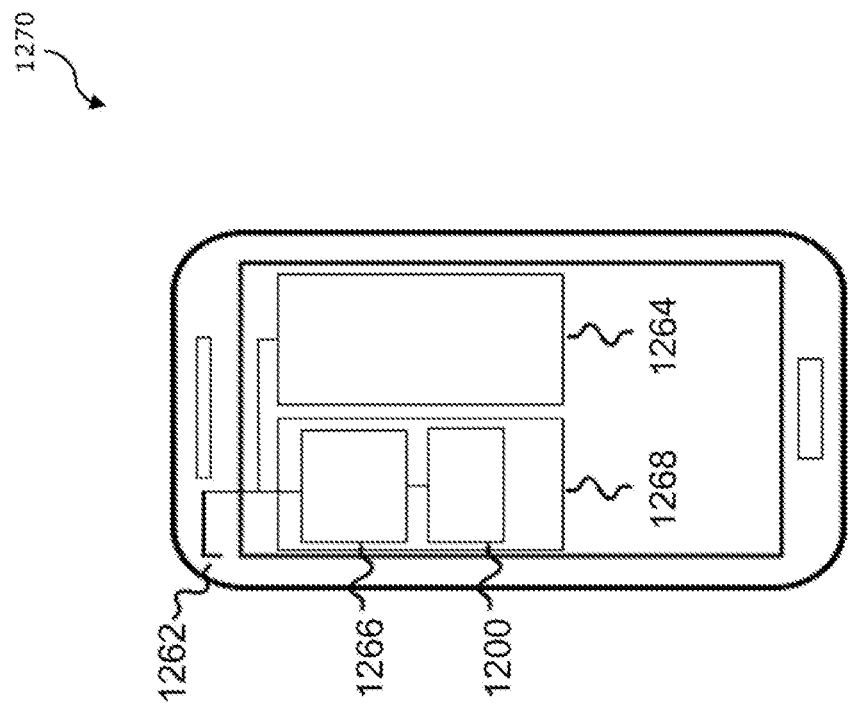
FIG. 12 illustrates an example of a mobile device.
Figure 13:
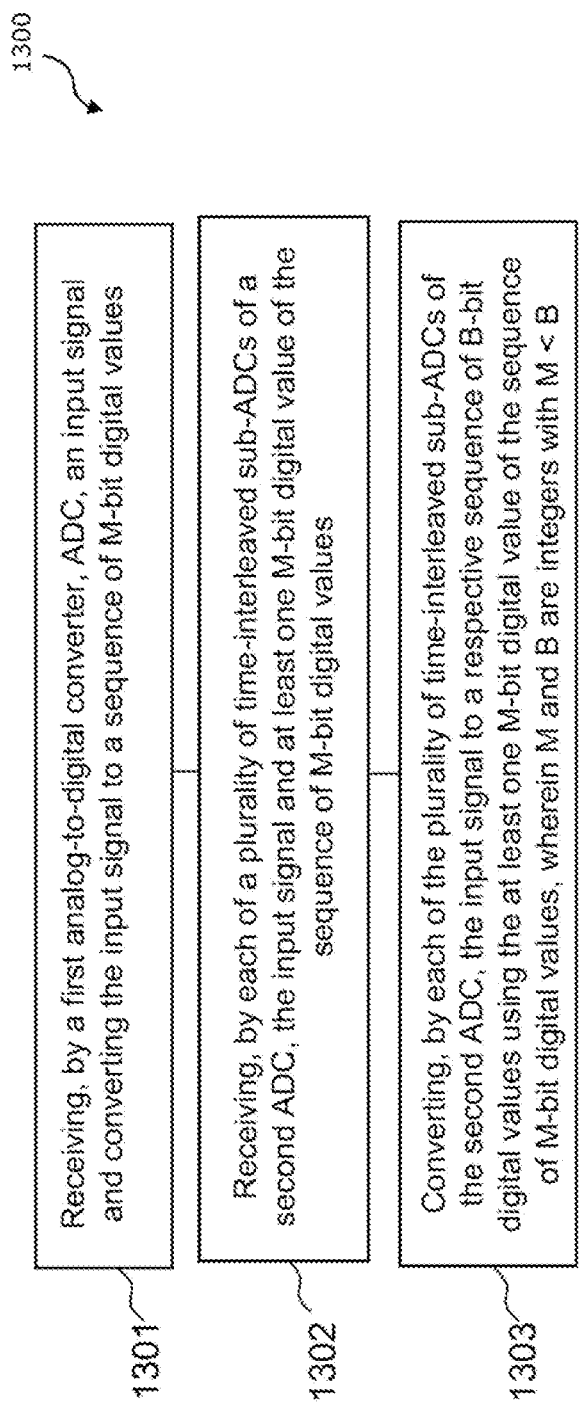
FIG. 13 illustrates a flowchart of an example of a method for analog-to-digital conversion.

Another example of an implementation using analog-to-digital conversion according to one or more aspects of the proposed apparatuses or systems described above in connection with FIGS. 1 to 10 or one or more examples described above in connection with FIGS. 1 to 10 is illustrated in FIG. 12. FIG. 12 schematically illustrates an example of a mobile device 1270 (e.g. mobile phone, smartphone, tablet-computer, or laptop) comprising an apparatus (or system) 1200 as proposed.

A receiver 1268 of the mobile device 1270 comprises the apparatus (or system) 1200. The receiver 1270 additionally comprises analog circuitry 1266 configured to receive an RF receive signal from at least one antenna element 1262 of the mobile device 1270. The analog circuitry 1266 is further configured to supply the input signal to the apparatus (or system) 1200 based on the RF receive signal. The apparatus (or system) 1200 generates digital data based on the input signal. For example, the analog circuitry 1266 may be an analog RF front-end and comprise one or more of a LNA, a filter, a down-conversion mixer, ESD protection circuitry, an attenuator etc.

Further, the mobile device 1270 comprises a transmitter 1264 configured to generate an RF transmit signal. The transmitter 1264 may use the antenna element 1262 or another antenna element (not illustrated) of the mobile device 1270 for radiating the RF transmit signal to the environment.

To this end, a mobile device with improved analog-to-digital conversion capabilities may be provided.

The mobile device 1270 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I2C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using analog-to-digital conversion according to the proposed technique or one or more of the examples described above may be configured to operate according to one of the 3rd Generation Partnership Project (3GPP)-standardized mobile communication networks or systems. The mobile or wireless communication system may correspond to, for example, a 5th Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UT-RAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

However, it is to be noted that the proposed apparatus or system might be used not only in receivers for wireless signals. The proposed ADC system may, for example, be used for high precision instrumentation or wireline receivers as well. Therefore, examples of the present disclosure further relate to a receiver comprising an apparatus or system as proposed herein and analog circuitry configured to receive a receive signal from a wired transmission link. The analog circuitry is configured to supply the input signal to the apparatus or system based on the receive signal. For example, the analog circuitry may comprise one or more of a LNA, a filter, a down-conversion mixer, ESD protection circuitry, an attenuator etc. Further, examples relate to any electronic device comprising the proposed apparatus or system.

For further illustrating the analog-to-digital conversion described above, FIG. 13 illustrates a flowchart of a method 1300 for analog-to digital conversion. The method 1300 comprises receiving 1301, by a first analog-to-digital converter, ADC, an input signal and converting the input signal to a sequence of M-bit digital values. The method 1300 further comprises receiving 1302, by each of a plurality of time-interleaved sub-ADCs of a second ADC, the input signal and at least one M-bit digital value of the sequence of M-bit digital values. Further, the method 1300 comprises converting, by each of the plurality of time-interleaved sub-ADCs of the second ADC, the input signal to a respective sequence of B-bit digital values using the at least one M-bit digital value of the sequence of M-bit digital values. M and B are integers with M<B.

Optionally the method 1300 further comprises sampling, by the first ADC, the input signal at a first sampling frequency and sampling, by one of the plurality of time-interleaved sub-ADCs, the input signal at a second sampling frequency being lower than the first sampling frequency.

The method 1300 may allow to use an output of the first (e.g. fast) ADC to supply a coarse information indicated by the sequence of M-bit digital values. The sequence of M-bit digital values can be used by each of the sub-ADCs of the second TI-ADC to provide a high accuracy digital output signal. According to the proposed technique, less sub-ADCs may be needed to achieve a target sampling rate for a desired accuracy.

More details and aspects of the method 1300 are explained in connection with the proposed technique or one or more examples described above (e.g. FIGS. 1 to 12). The method 1300 may comprise one or more additional optional features corresponding to one or more aspects of the proposed technique or one or more examples described above.

The examples described herein may be summarized as follows:

An example (e.g. example 1) relates to an apparatus for analog-to-digital conversion, comprising: a first analog-to-digital converter, ADC, configured to receive an input signal and convert the input signal to a sequence of M-bit digital values; a second ADC comprising a plurality of time-interleaved sub-ADCs each being configured to: receive the input signal and at least one M-bit digital value of the sequence of M-bit digital values; and convert the input signal to a respective sequence of B-bit digital values using the at least one M-bit digital value of the sequence of M-bit digital values, wherein M and B are integers with M<B.

Another example (e.g. example 2) relates to a previously described example (e.g. example 1), wherein the first ADC is configured to sample the input signal at a first sampling frequency and one of the plurality of time-interleaved sub-ADCs is configured to sample the input signal at a second sampling frequency being lower than the first sampling frequency.

Another example (e.g. example 3) relates to a previously described example (e.g. one of the examples 1-2), wherein the first ADC comprises a sampling capacitor with capacitance $C_{S,1}$, at least one sub-ADC of the second ADC comprises a sampling capacitor with capacitance $C_S$, and a ratio of sampling capacitances $C_{S,1}/C_S$ is equal to or higher than $(2^M-1/2^B-1)^2$.

Another example (e.g. example 4) relates to a previously described example (e.g. one of the examples 1-3), wherein the first ADC is configured to sample the input signal during a first sampling period, and one of the plurality of time-interleaved sub-ADCs is configured to sample the input signal during a second sampling period being equal or longer than the first sampling period.

Another example (e.g. example 5) relates to a previously described example (e.g. example 4), wherein an end of the first sampling period is equal to an end of the second sampling period.

Another example (e.g. example 6) relates to a previously described example (e.g. one of the examples 4-5), wherein the first ADC is configured to convert a first sample obtained by sampling the input signal during the first sampling period to one of the sequence of M-bit digital values during a first conversion period, and the one of the plurality of time-interleaved sub-ADCs is configured to convert a second sample obtained by sampling the input signal during the second sampling period to one of the sequence of B-bit digital values during a second conversion period being longer than the first conversion period.

Another example (e.g. example 7) relates to a previously described example (e.g. example 6), wherein the second conversion period is at least three times the first conversion period.

Another example (e.g. example 8) relates to a previously described example (e.g. one of the examples 1-7), wherein the first ADC is a flash ADC.

Another example (e.g. example 9) relates to a previously described example (e.g. one of the examples 1-8), wherein the sub-ADCs of the second ADC are one of a successive-approximation ADC, a folding-ADC, a subranging ADC or pipeline ADC.

Another example (e.g. example 10) relates to a previously described example (e.g. one of the examples 1-9), further comprising: circuitry configured to receive the input signal and determine a sign of the input signal and to supply a sequence of 1-bit digital values, circuitry configured to generate a sequence of M+1-bit digital values being based on the sequence of M-bit digital values and the sequence of the 1-bit digital values; wherein the first ADC is configured to use the sequence of 1-bit digital values to convert the input signal to the sequence of M-bit digital values; wherein each sub-ADC is configured to: receive at least one M+1-bit digital value of the sequence of M+1-bit digital values; and convert the input signal to the respective sequence of B-bit digital values using the at least one M+1-bit digital value of the sequence of M+1-bit digital values.

Another example (e.g. example 11) relates to a previously described example (e.g. one of the examples 1-10), further comprising: a buffer circuit configured to buffer the input signal, wherein an input of the first ADC is coupled to either an input or an output of the buffer circuit.

Another example (e.g. example 12) relates to a previously described example (e.g. one of the examples 1-11), further comprising: a combiner circuit configured to combine the sequences of B-bit digital values by the sub-ADCs to a digital output signal.

An example (e.g. example 13) relates to a system for analog-to-digital conversion, comprising: a plurality of apparatuses for analog-to-digital conversion relating to a previously described example (e.g. one of the examples 1 to 11); and a combiner circuit configured to combine the sequences of B-bit digital values by the sub-ADCs of the plurality of apparatuses for analog-to-digital conversion to a digital output signal.

Another example (e.g. example 14) relates to a previously described example (e.g. example 13), further comprising: a common buffer circuit being upstream of the plurality of apparatuses for analog-to-digital conversion and configured to receive the input signal and output a buffered input signal; and a plurality of sample and hold circuits, S-H circuits, for the plurality of apparatuses for analog-to-digital conversion, wherein each of the plurality of S-H circuits is coupled to an output of the common buffer circuit to receive the buffered input signal and is coupled to an input of a respective one of the plurality of apparatuses for analog-to-digital conversion.

An example (e.g. example 15) relates to a system for analog-to-digital conversion, comprising: a first Analog-to-Digital Converter, ADC, configured to receive an input signal and convert the input signal to a sequence of M-bit digital values; a plurality of apparatuses for analog-to-digital conversion, each comprising: a second ADC comprising a plurality of time-interleaved sub-ADCs each being configured to: receive the input signal and at least one M-bit digital value of the sequence of M-bit digital values; and convert the input signal to a respective sequence of B-bit digital values using the at least one M-bit digital value of the sequence of M-bit digital values, wherein M and B are integers with M<B; and a combiner circuit configured to combine the sequences of B-bit digital values by the sub-ADCs of the plurality of apparatuses for analog-to-digital conversion to a digital output signal.

Another example (e.g. example 16) relates to a previously described example (e.g. example 15), further comprising: a common buffer circuit being upstream of the plurality of apparatuses for analog-to-digital conversion and configured to receive the input signal and output a buffered input signal for each apparatus of the plurality of apparatuses.

Another example (e.g. example 17) relates to a previously described example (e.g. example 16), wherein the first ADC is coupled to an input of the common buffer circuit.

Another example (e.g. example 18) relates to a previously described example (e.g. example 16), further comprising: a plurality of sample and hold circuits, S-H circuits, for the plurality of apparatuses, wherein each S-H circuit of the plurality of S-H circuits is coupled to an output of the common buffer circuit to receive the buffered input signal and is coupled to a respective input of one of the plurality of apparatuses, wherein the first ADC is coupled to an output of the common buffer circuit and to the inputs of the plurality of S-H circuits.

An example (e.g. example 19) relates to a receiver, comprising: an apparatus relating to a previously described example (e.g. one of the examples 1 to 12) or a system relating to a previously described example (e.g. one of the examples 13 to 18); and analog circuitry configured to receive a receive signal and to supply the input signal to the apparatus or the system based on the receive signal.

Another example (e.g. example 20) relates to a previously described example (e.g. example 19), wherein the input signal is a radio frequency signal.

An example (e.g. example 21) relates to a base station, comprising: a receiver relating to a previously described example (e.g. one of the examples 19 to 20); and a transmitter configured to generate a radio frequency transmit signal.

Another example (e.g. example 22) relates to a previously described example (e.g. example 21), further comprising: at least one antenna element coupled to at least one of the receiver and the transmitter.

An example (e.g. example 23) relates to a mobile device, comprising: a receiver relating to a previously described example (e.g. one of the examples 19 to 20); and a transmitter configured to generate a radio frequency transmit signal.

Another example (e.g. example 24) relates to a previously described example (e.g. example 23), further comprising: at least one antenna element coupled to at least one of the receiver and the transmitter.

An example (e.g. example 25) relates to a method for analog-to-digital conversion, comprising: receiving, by a first Analog-to-Digital Converter, ADC, an input signal and converting the input signal to a sequence of M-bit digital values; receiving, by each of a plurality of time-interleaved sub-ADCs of a second ADC, the input signal and at least one M-bit digital value of the sequence of M-bit digital values; and converting, by each of the plurality of time-interleaved sub-ADCs of the second ADC, the input signal to a respective sequence of B-bit digital values using the at least one M-bit digital value of the sequence of M-bit digital values, wherein M and B are integers with M<B.

Another example (e.g. example 26) relates to a previously described example (e.g. example 25), further comprising: sampling, by the first ADC, the input signal at a first sampling frequency; and sampling, by one of the plurality of time-interleaved sub-ADCs, the input signal at a second sampling frequency being lower than the first sampling frequency.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus for analog-to-digital conversion, comprising:
   a first analog-to-digital converter, ADC, configured to;
      receive an input signal;
      sample the input signal at a first sampling frequency; and
      convert the input signal to a sequence of M-bit digital values;
   a second ADC comprising a plurality of time-interleaved sub-ADCs each being configured to:
      receive the input signal and at least one M-bit digital value of the sequence of M-bit digital values;
      sample the input signal at a second sampling frequency being lower than the first sampling frequency; and
      convert the input signal to a respective sequence of B-bit digital values using the at least one M-bit digital value of the sequence of M-bit digital values, wherein M and B are integers with M<B.

2. The apparatus according to claim 1, wherein
   the first ADC comprises a sampling capacitor with capacitance $C_{(S,1)}$,
   at least one sub-ADC of the second ADC comprises a sampling capacitor with
   capacitance $C\_S$, and
   a ratio of sampling capacitances $C_{(S,1)}/C\_S$ is equal to or higher than $((2^M-1)/(2^B-1))^2$.

3. The apparatus according to claim 1, wherein
   the first ADC is configured to sample the input signal during a first sampling period, and
   one of the plurality of time-interleaved sub-ADCs is configured to sample the input signal during a second sampling period being equal or longer than the first sampling period.

4. The apparatus according to claim 3, wherein
   an end of the first sampling period is equal to an end of the second sampling period.

5. The apparatus according to claim 3, wherein
   the first ADC is configured to convert a first sample obtained by sampling the input signal during the first sampling period to one of the sequence of M-bit digital values during a first conversion period, and
   the one of the plurality of time-interleaved sub-ADCs is configured to convert a second sample obtained by sampling the input signal during the second sampling period to one of the sequence of B-bit digital values during a second conversion period being longer than the first conversion period.

6. The apparatus according to claim 5, wherein
   the second conversion period is at least three times the first conversion period.

7. The apparatus according to claim 1, wherein
   the first ADC is a flash ADC.

8. The apparatus according to claim 1, wherein
   the sub-ADCs of the second ADC are one of a successive-approximation ADC, a folding-ADC, a subranging ADC or a pipeline ADC.

9. The apparatus according to claim 1, further comprising:
   circuitry configured to receive the input signal and determine a sign of the input signal and to supply a sequence of 1-bit digital values,
   circuitry configured to generate a sequence of M+1-bit digital values being based on the sequence of M-bit digital values and the sequence of the 1-bit digital values;
   wherein the first ADC is configured to use the sequence of 1-bit digital values to convert the input signal to the sequence of M-bit digital values;
   wherein each sub-ADC is configured to:
      receive at least one M+1-bit digital value of the sequence of M+1-bit digital values; and
      convert the input signal to the respective sequence of B-bit digital values using the at least one M+1-bit digital value of the sequence of M+1-bit digital values.

10. The apparatus according to claim 1, further comprising:
    a buffer circuit configured to buffer the input signal,
    wherein an input of the first ADC is coupled to either an input or an output of the buffer circuit.

11. The apparatus according to claim 1, further comprising:
    a combiner circuit configured to combine the sequences of B-bit digital values by the sub-ADCs to a digital output signal.

12. A system for analog-to-digital conversion, comprising:
    a plurality of apparatuses for analog-to-digital conversion according to claim 1; and
    a combiner circuit configured to combine the sequences of B-bit digital values by the sub-ADCs of the plurality of apparatuses for analog-to-digital conversion to a digital output signal.

13. The system according to claim 12, further comprising:
    a common buffer circuit being upstream of the plurality of apparatuses for analog-to-digital conversion and configured to receive the input signal and output a buffered input signal; and
    a plurality of sample and hold circuits, S-H circuits, for the plurality of apparatuses for analog-to-digital conversion, wherein each of the plurality of S-H circuits is coupled to an output of the common buffer circuit to receive the buffered input signal and is coupled to an input of a respective one of the plurality of apparatuses for analog-to-digital conversion.

14. A system for analog-to-digital conversion, comprising:
- a first analog-to-digital converter, ADC, configured to;
  - receive an input signal;
  - sample the input signal at a first sampling frequency; and
  - convert the input signal to a sequence of M-bit digital values;
- a plurality of apparatuses for analog-to-digital conversion, each comprising:
  - a second ADC comprising a plurality of time-interleaved sub-ADCs each being configured to:
    - receive the input signal and at least one M-bit digital value of the sequence of M-bit digital values;
    - sample the input signal at a second sampling frequency being lower than the first sampling frequency; and
    - convert the input signal to a respective sequence of B-bit digital values using the at least one M-bit digital value of the sequence of M-bit digital values,
    - wherein M and B are integers with M<B; and
- a combiner circuit configured to combine the sequences of B-bit digital values by the sub-ADCs of the plurality of apparatuses for analog-to-digital conversion to a digital output signal.

15. The system according to claim 14, further comprising:
a common buffer circuit being upstream of the plurality of apparatuses for analog-to-digital conversion and configured to receive the input signal and output a buffered input signal for each apparatus of the plurality of apparatuses.

16. The system according to claim 15, wherein the first ADC is coupled to an input of the common buffer circuit.

17. The system according to claim 15, further comprising:
- a plurality of sample and hold circuits, S-H circuits, for the plurality of apparatuses,
- wherein each S-H circuit of the plurality of S-H circuits is coupled to an output of the common buffer circuit to receive the buffered input signal and is coupled to a respective input of one of the plurality of apparatuses,
- wherein the first ADC is coupled to an output of the common buffer circuit and to the inputs of the plurality of S-H circuits.

18. A method for analog-to-digital conversion, comprising:
- receiving, by a first Analog-to-Digital Converter, ADC, an input signal;
- sampling, by the first ADC, the input signal at a first sampling frequency; and
- converting, by the first ADC, the input signal to a sequence of M-bit digital values;
- receiving, by each of a plurality of time-interleaved sub-ADCs of a second ADC, the input signal and at least one M-bit digital value of the sequence of M-bit digital values;
- sampling, by one of the plurality of time-interleaved sub-ADCs, the input signal at a second sampling frequency being lower than the first sampling frequency; and
- converting, by each of the plurality of time-interleaved sub-ADCs of the second ADC, the input signal to a respective sequence of B-bit digital values using the at least one M-bit digital value of the sequence of M-bit digital values, wherein M and B are integers with M<B.

* * * * *